United States Patent
Fujiwara et al.

(10) Patent No.: US 9,722,573 B2
(45) Date of Patent: Aug. 1, 2017

(54) HIGH FREQUENCY FILTER WITH PHASE COMPENSATING CIRCUIT

(71) Applicant: SKYWORKS FILTER SOLUTIONS JAPAN CO., LTD., Kadoma-Shi (JP)

(72) Inventors: Joji Fujiwara, Osaka-Fu (JP); Toru Jibu, Irvine, CA (US); Tomoya Komatsu, Osaka-Fu (JP); Hiroyuki Nakamura, Osaka-Fu (JP); Tetsuya Tsurunari, Osaka-Fu (JP); Kazunori Nishimura, Kyoto-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 15/375,803

(22) Filed: Dec. 12, 2016

(65) Prior Publication Data

US 2017/0093373 A1    Mar. 30, 2017

Related U.S. Application Data

(63) Continuation of application No. 14/969,222, filed on Dec. 15, 2015, now Pat. No. 9,520,857, which is a
(Continued)

(30) Foreign Application Priority Data

Oct. 18, 2012  (JP) ................... 2012-230706
Dec. 14, 2012  (JP) ................... 2012-273173
(Continued)

(51) Int. Cl.
*H04B 1/40*      (2015.01)
*H03H 9/64*      (2006.01)
(Continued)

(52) U.S. Cl.
CPC ........ *H03H 9/6413* (2013.01); *H03H 9/0028* (2013.01); *H03H 9/542* (2013.01); *H04B 1/40* (2013.01)

(58) Field of Classification Search
CPC ....................................................... H04B 1/40
(Continued)

(56) References Cited

U.S. PATENT DOCUMENTS 5,905,418 A    5/1999  Ehara et al.
6,262,637 B1   7/2001  Bradley et al.
(Continued)

FOREIGN PATENT DOCUMENTS

JP    H09312587 A    12/1997
JP    2002158599 A    5/2002
(Continued)

*Primary Examiner* — April G Gonzales
(74) *Attorney, Agent, or Firm* — Lando & Anastasi, LLP

(57) ABSTRACT

A high-frequency filter including first and second signal terminals, a filter circuit having a passband and a stopband and being connected between the first signal terminal and the second signal terminal, and an additional circuit connected in parallel with the filter circuit between the first signal terminal and the second signal terminal. The filter circuit is configured to provide a first output signal responsive to receipt of an input signal. The additional circuit has an attenuation band within the stopband, and is configured to provide a second output signal responsive to receiving the input signal, the first and second output signals having phase components opposite to each other in the attenuation band.

20 Claims, 27 Drawing Sheets

Related U.S. Application Data continuation of application No. 14/050,351, filed on Oct. 10, 2013, now Pat. No. 9,246,533.

(30) Foreign Application Priority Data

Feb. 8, 2013 (JP) ................................. 2013-022887
Mar. 19, 2013 (JP) ................................. 2013-056336

(51) Int. Cl.
*H03H 9/54* (2006.01)
*H03H 9/00* (2006.01)

(58) Field of Classification Search
USPC .......................................................... 455/73
See application file for complete search history.

(56) References Cited

U.S. PATENT DOCUMENTS

| | | | |
|---|---|---|---|
| 6,404,302 B1 | 6/2002 | Satoh et al. | |
| 6,677,835 B2 | 1/2004 | Noguchi et al. | |
| 7,733,196 B2 | 6/2010 | Tsurunari et al. | |
| 7,941,103 B2 | 5/2011 | Iwamoto et al. | |
| 8,174,339 B2 | 5/2012 | Matsuda et al. | |
| 8,228,137 B2 | 7/2012 | Inoue et al. | |
| 8,378,760 B2 | 2/2013 | Iwaki et al. | |
| 8,618,992 B2 | 12/2013 | Fujiwara et al. | |
| 2007/0090895 A1* | 4/2007 | Nishizawa | H03H 9/0057 333/133 |
| 2010/0026419 A1* | 2/2010 | Hara | H03H 9/0028 333/175 |
| 2010/0150075 A1* | 6/2010 | Inoue | H03H 9/725 370/328 |
| 2011/0254639 A1* | 10/2011 | Tsutsumi | H01P 1/213 333/132 |
| 2012/0119847 A1* | 5/2012 | Iwaki | H03H 9/0542 333/133 |
| 2013/0113576 A1* | 5/2013 | Inoue | H03H 9/6433 333/133 |

FOREIGN PATENT DOCUMENTS

| | | |
|---|---|---|
| JP | 2004242280 A | 8/2004 |
| JP | 2006311041 A | 11/2006 |
| JP | 2007124085 A | 5/2007 |
| JP | 2010041141 A | 2/2010 |
| JP | 2010154437 A | 7/2010 |
| JP | 2011160203 A | 8/2011 |
| JP | 2012109818 A | 6/2012 |
| JP | 2013-048491 A | 3/2013 |
| JP | 2013118611 A | 6/2013 |
| WO | 2009025106 A1 | 2/2009 |
| WO | 2010073377 A1 | 7/2010 |

\* cited by examiner

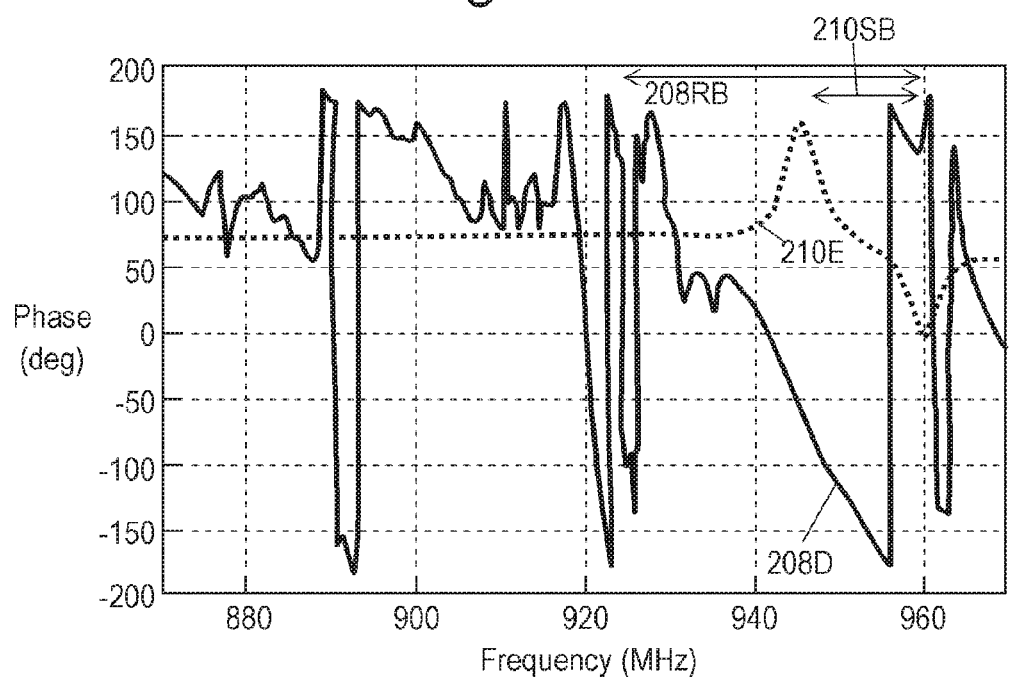
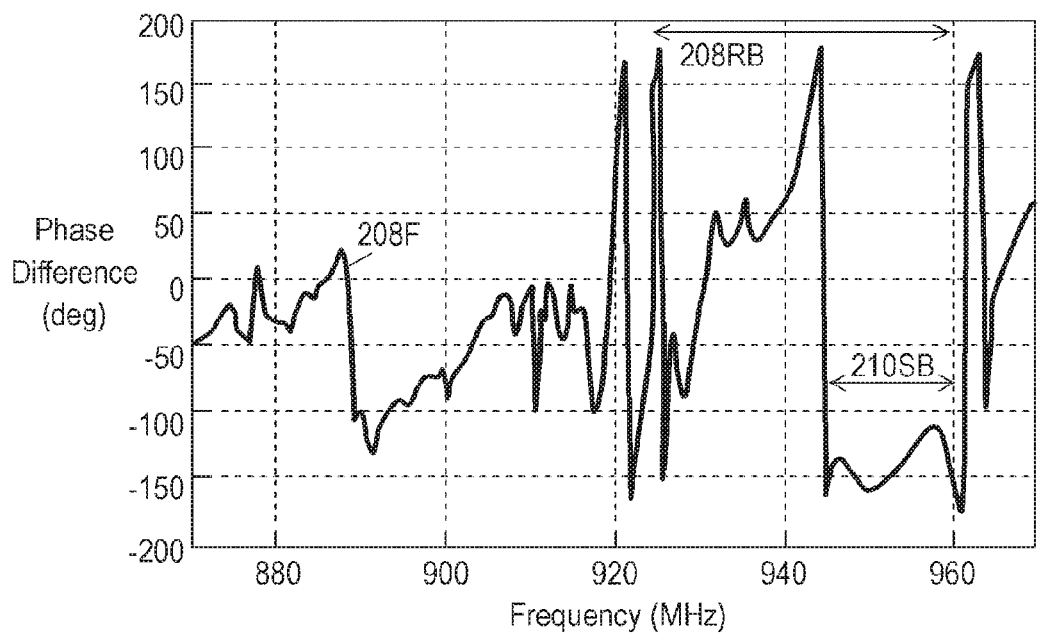

HIGH FREQUENCY FILTER WITH PHASE COMPENSATING CIRCUIT

CROSS-REFERENCE TO RELATED APPLICATIONS

This application is a continuation of and claims priority under 35 U.S.C. §120 to co-pending U.S. application Ser. No. 14/969,222 titled "ELECTRONIC DEVICE INCLUDING FILTER" and filed on Dec. 15, 2015, which is a continuation of and claims priority under 35 U.S.C. §120 to U.S. application Ser. No. 14/050,351 titled "ELECTRONIC DEVICE INCLUDING FILTER" and filed on Oct. 10, 2013, now U.S. Pat. No. 9,246,533, both of which are herein incorporated by reference in their entireties for all purposes. U.S. application Ser. No. 14/050,351 claims priority under 35 U.S.C. §119 to Japanese Application Nos. JP 2012-230706 filed on Oct. 18, 2012, JP 2012-273173 filed on Dec. 14, 2012, JP 2013-022887 filed on Feb. 8, 2013, and JP 2013-056336 filed on Mar. 19, 2013.

TECHNICAL FIELD

The present invention relates to an electronic device including a filter for use in various telecommunications apparatuses and electronic devices.

BACKGROUND ART

FIG. 28 is a circuit diagram of conventional electronic device 1301, a high-frequency filter, used in an electronic device, such as a radio communications apparatus. Electronic device 1301 includes input/output terminals 1302 and 1303, signal line 1304, series arm resonators 1305, and parallel arm resonators 1306. Signal line 1304 connects between input/output terminals 1302 and 1303. Series arm resonators 1305 are connected in series to each other along signal line 1304. Parallel arm resonators 1306 are connected between signal line 1304 and reference potential 1308. Series arm resonators 1305 and parallel arm resonators 1306 constitute a ladder circuit, and function as a band-pass filter having a passband and stopbands.

Conventional electronic device 1301 has a limitation in an attenuation amount in the stopbands, and is prevented from having a large attenuation amount in a particular stopband.

In recent years, downsizing of radio communications apparatuses such as mobile phones continues being advanced. For this purpose, the number of components used in radio communications apparatuses is decreased. In a radio circuit section of such a radio communications apparatus, the number of components can be decreased by reducing inter-stage filters in a transmission signal path and a reception signal path. However, it is necessary to improve an isolation characteristic of antenna duplexers in order to reduce the number of the components.

FIG. 29 is a circuit schematic diagram of another conventional electronic device 1000, an antenna duplexer. Electronic device 1000 includes phase shifter circuit 1006 connected to common terminal 1003, filter 1001 connected to transmitting terminal 1004, and filter 1002 connected to receiving terminal 1005. Both filters 1001 and 1002 are connected to common terminal 1003 via phase shifter circuit 1006. In electronic device 1000, capacitor element 1007, an external circuit, is connected between transmitting terminal 1004 and receiving terminal 1005 provides path 1000A from transmitting terminal 1004 to receiving terminal 1005 via filter 1001, phase shifter circuit 1006, and filter 1002, and another path 1000B from transmitting terminal 1004 to receiving terminal 1005 via capacitor element 1007. Electronic device 1000 can making a difference in phase of about 180 degrees between a signal passing through path 1000A and another signal passing through path 1000B by adjusting an amount of phase shift of phase shifter circuit 1006, thereby canceling these signals passing from transmitting terminal 1004 to receiving terminal 1005 to secure an isolation characteristic.

An electronic device, a conventional antenna duplexer similar to electronic device 1000, is disclosed in, for example, WO2010/073377. The isolation characteristic can be improved according to this literature. The isolation characteristic of electronic device 1000 however may degrade depending on ambient temperatures.

FIG. 30 is a circuit schematic diagram of conventional electronic device 1000 shown in FIG. 29 used as an antenna duplexer mounted to radio communications apparatus 1200. Common terminal 1003 of electronic device 1000 is connected to antenna 1201, transmitting terminal 1004 is connected to transmitter circuit 1202, and receiving terminal 1005 is connected to receiver circuit 1203. A transmission signal generated in transmitter circuit 1202 is input through transmitting terminal 1004, and output from common terminal 1003 and via antenna 1201 as a radio wave. An incoming signal received from antenna 1201 is input to common terminal 1003, and output to receiver circuit 1203 from receiving terminal 1005.

In electronic device 1000, the incoming signal input from receiving terminal 1005 is weak whereas the transmission signal input from transmitting terminal 1004 is strong. A part of power of the transmission signal may leak to filter 1002 and causes an adverse influence on a receiving performance.

FIG. 31 is a circuit diagram of another conventional electronic device 540, a high-frequency filter used as an antenna duplexer in a radio communications apparatus. Electronic device 540 includes piezoelectric substrate 531, filters 511 and 512, antenna terminal 513, unbalanced transmitting terminal 514, a pair of balanced receiving terminals 515A and 515B, ground 516, and inductor 517. Both filters 511 and 512 are formed on piezoelectric substrate 531. Filter 511 has signal line 518 connects from antenna terminal 513 to transmitting terminal 514. Filter 511 includes series arm resonators 519 connected in series to each other along signal line 518 between antenna terminal 513 and transmitting terminal 514. Filter 511 further includes parallel arm resonators 520 connected between signal line 518 and ground 516. Series arm resonators 519 and parallel arm resonators 520 constitute a ladder-type filter. Filter 512 includes one one-port resonator 521, three non-inverting type longitudinally coupled resonators 522 and one inverting type longitudinally coupled resonator 523 that are connected between antenna terminal 513 and each of the pair of balanced receiving terminals 515A and 515B so as to constitute a band-pass filter having an unbalanced-to-balanced converting function.

Conventional electronic device 540 may not have a sufficient isolation between transmitting terminal 514 and each of receiving terminals 515A and 515B, accordingly being prevented from having an adequate attenuation amount in a receiving band.

SUMMARY

An electronic device includes a main circuit connected between an input terminal and an output terminal, and an auxiliary circuit connected in parallel to the main circuit between the input terminal and the output terminal. The main circuit includes a filter having a first passband and a stopband. The auxiliary circuit has a passing characteristic that allows a signal having a frequency in a certain frequency band inside the stopband to pass through the auxiliary circuit. The main circuit is configured to output a main signal in response to an input signal. The auxiliary circuit is configured to output an auxiliary signal in response to the input signal. The main signal and the auxiliary signal contain phase components opposite to each other in the certain frequency band inside the stopband.

This electronic device has an attenuation amount in the stopband.

BRIEF DESCRIPTION OF DRAWINGS

FIGS. 9 to 13 are characteristic charts of the electronic device according to Embodiment 2.

DETAIL DESCRIPTION OF PREFERRED EMBODIMENTS

Exemplary Embodiment 1

Figure 1:
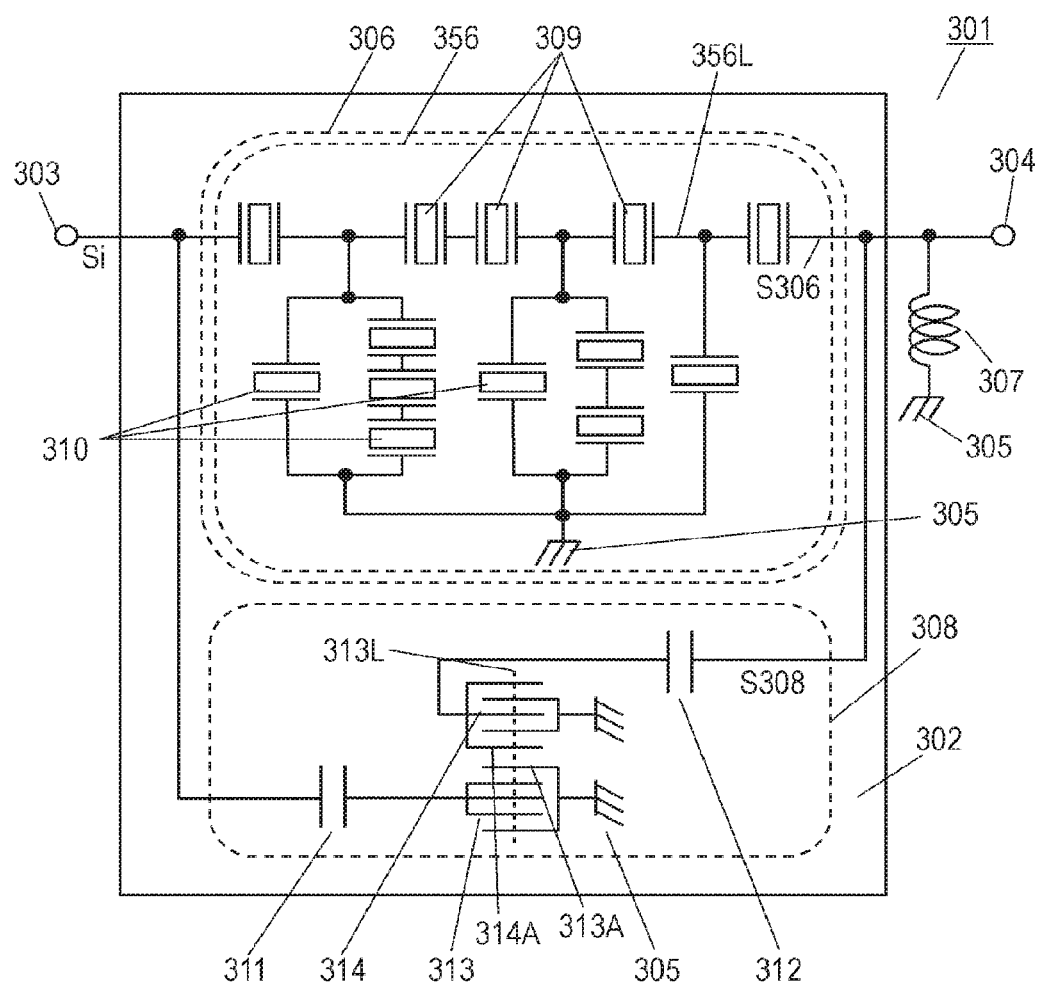
FIG. 1 is a circuit diagram of an electronic device according to Exemplary Embodiment 1 of the present invention.

FIG. 1 is a circuit diagram of electronic device 301 according to Exemplary Embodiment 1 of the present invention. Electronic device 301 according to Embodiment 1 is a high—frequency filter. Electronic device 301 includes piezoelectric substrate 302, input terminal 303, output terminal 304, reference potential 305, main circuit 306, inductor 307, and auxiliary circuit 308.

Main circuit 306 includes filter 356 having signal line 356L connecting input terminal 303 to output terminal 304. Filter 356 includes series arm resonators 309 and parallel arm resonators 310. Series arm resonators 309 are connected in series to each other along signal line 356L between input terminal 303 and output terminal 304. Parallel arm resonators 310 are connected between signal line 356L and reference potential 305. Series arm resonators 309 and parallel arm resonators 310 are surface acoustic wave resonators formed on piezoelectric substrate 302, and constitute a ladder circuit. Filter 356 functions as a band-pass filter having a passband and a stopband. Series arm resonators 309 and parallel arm resonators 310 may have different design parameters for the reason of circuit designing.

Auxiliary circuit 308 is connected in parallel to main circuit 306 between input terminal 303 and output terminal 304. Auxiliary circuit 308 has a passing characteristic similar to a passing characteristic of main circuit 306 in the stop band, especially in an attenuation band exhibiting a large attenuation in the stopband of filter 356 of main circuit 306. Auxiliary circuit 308 has a phase characteristic opposite to a phase characteristic of main circuit 306 in the attenuation band.

Auxiliary circuit 308 includes capacitor element 311, inter-digital transducer (IDT) electrodes 313 and 314, and capacitor element 312. Capacitor element 311, IDT electrodes 313 and 314, and capacitor element 312 are connected from input terminal 303 to output terminal 304 in this order, and are disposed on piezoelectric substrate 302. In other words, capacitor element 311 is disposed closer to input terminal 303 than capacitor element 312 is while capacitor element 312 is closer to output terminal 304 than capacitor element 311 is. IDT electrodes 313 and 314 are acoustic wave resonators, acoustic wave elements that utilize acoustic waves propagating on piezoelectric substrate 302. IDT electrodes 313 and 314 are disposed apart from each other by a predetermined distance between them along single acoustic wave path 313L along which the acoustic waves propagate, and constitute a transversal filter. The passing characteristic in the attenuation band is adjusted by designing this transversal filter, and the phase characteristic is adjusted by adjusting a distance between IDT electrodes 313 and 314, so as to provide auxiliary circuit 308 with the phase characteristic opposite to that of main circuit 306. Each of IDT electrodes 313 and 314 includes a pair of comb-shaped electrodes each including electrode fingers that interdigitate with each other.

Capacitances of capacitor elements 311 and 312 are smaller than capacitances of IDT electrodes 313 and 314. The capacitance of capacitor element 311 closer to input terminal 303 is smaller than that of capacitor element 312 closer to output terminal 304. An attenuation amount of the passing characteristic of auxiliary circuit 308 in the attenuation band can be adjusted by adjusting the capacitances of capacitor elements 311 and 312. Capacitor elements 311 and 312 are appropriately designed so as to allow the attenuation amount of the passing characteristic of auxiliary circuit 308 to be similar to an attenuation amount of the passing characteristic of main circuit 306.

Since the phase characteristic of auxiliary circuit 308 is opposite to that of main circuit 306, an amplitude characteristic in the attenuation band of main circuit 306 is canceled, consequently increasing the attenuation amount in the attenuation band. In addition, the phase characteristic of auxiliary circuit 308 can be adjusted finely by adjusting the distance between IDT electrodes 313 and 314. Furthermore, an electric current that flows into auxiliary circuit 308 from main circuit 306 can be suppressed by adjusting the electrostatic capacitances of capacitor elements 311 and 312, thereby having the function of protecting IDT electrodes 313 and 314 from damage.

Figure 2:
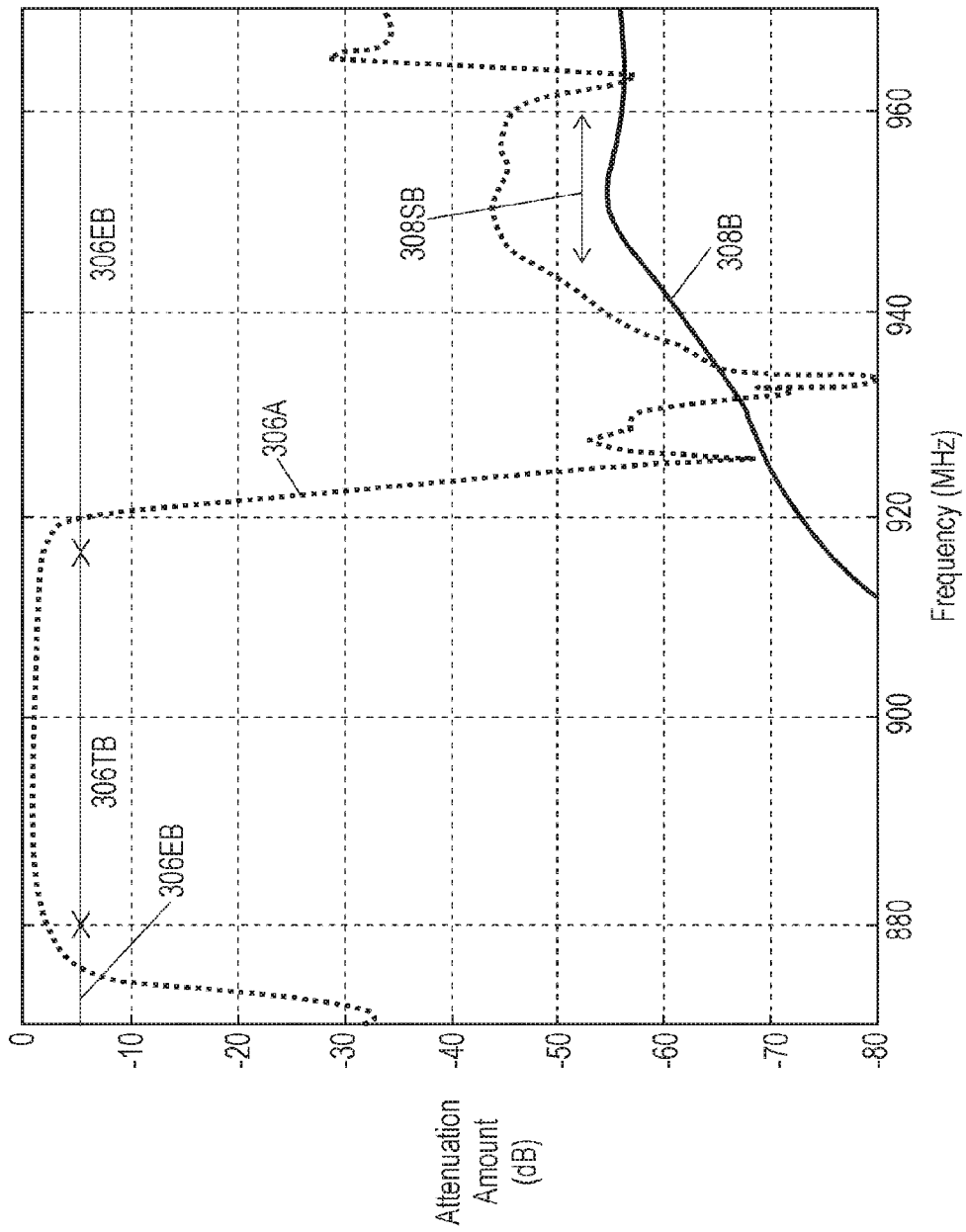
FIGS. 2 to 4 are characteristic charts of the electronic device according to Embodiment 1.
Figure 3:
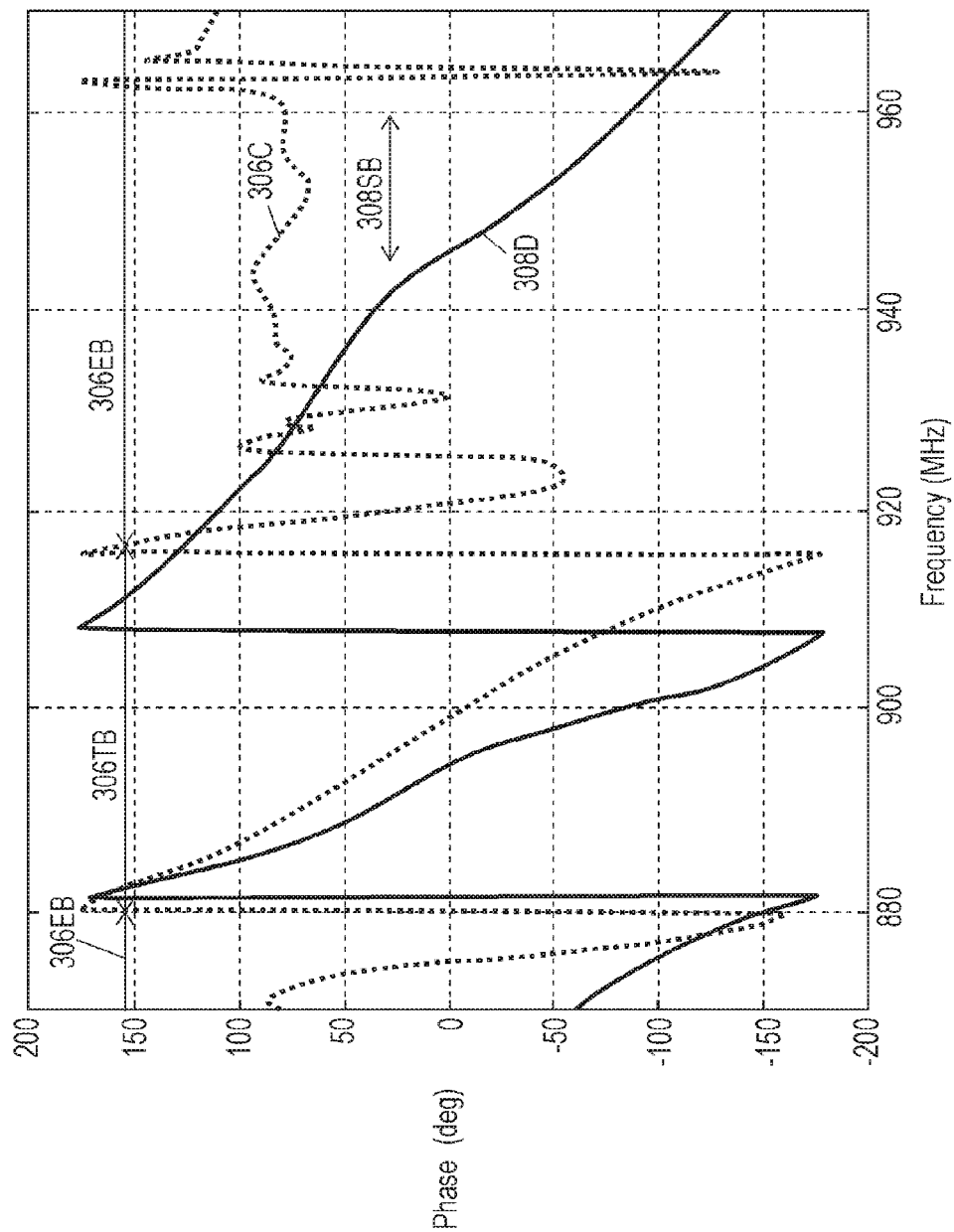
Figure 4:
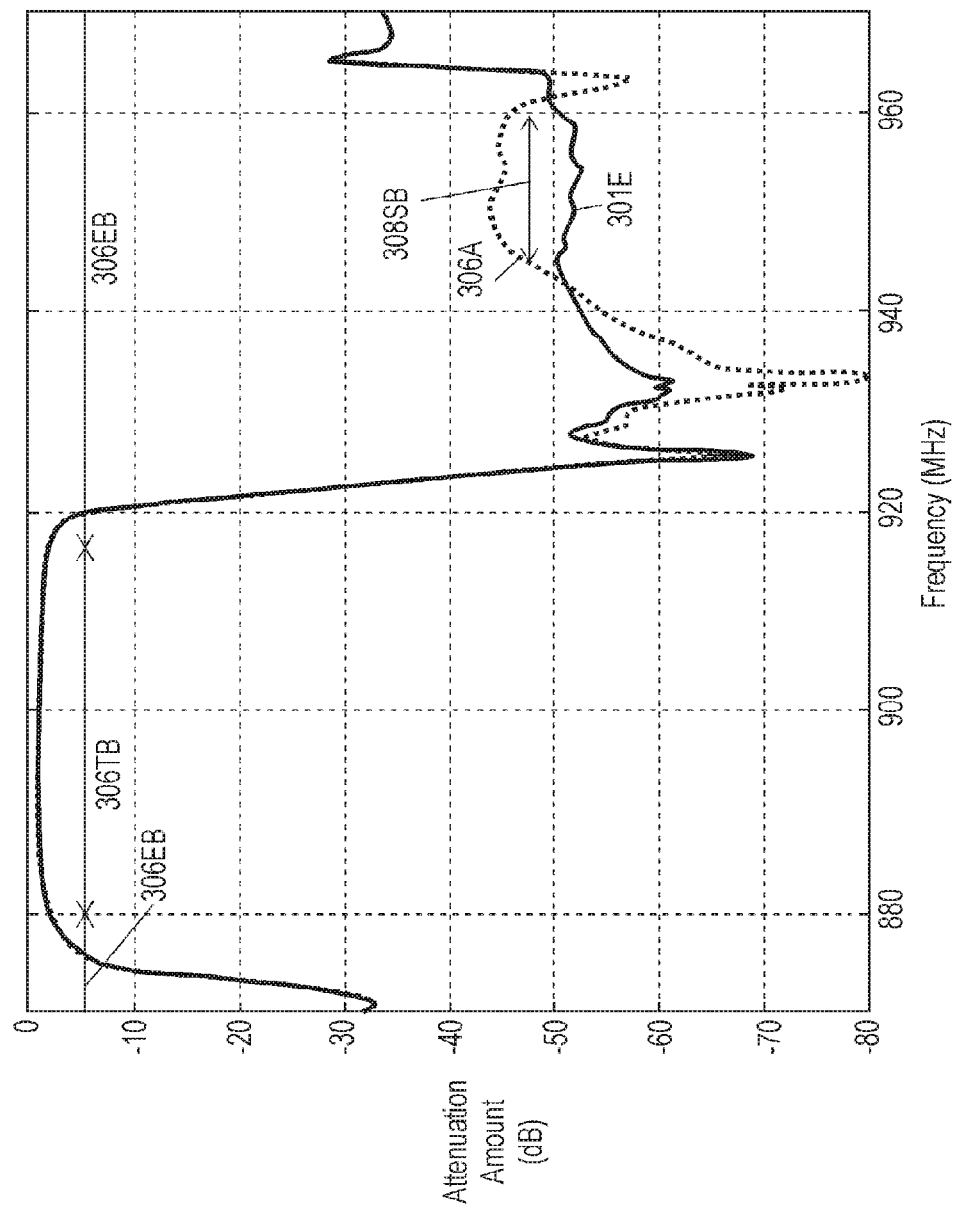

FIGS. 2 to 4 show passing characteristics of electronic device 301 according to Embodiment 1.

FIG. 2 shows amplitude characteristic 306A out of passing characteristics of main circuit 306 (filter 356 in this embodiment) and amplitude characteristic 308B out of the passing characteristics of auxiliary circuit 308 of electronic device 301. In FIG. 2, the vertical axis represents the attenuation amount of amplitude, and the horizontal axis represents a frequency. Amplitude characteristic 306A of main circuit 306 represents an amplitude characteristic of electronic device 301 when auxiliary circuit 308 is not connected. Amplitude characteristic 306A of main circuit 306 has passband 306TB from 880 MHz to 915 MHz, and stopband 306EB having frequencies lower than 880 MHz and higher than 915 MHz outside of passband 306TB. Attenuation band 308SB is a certain frequency band exhibiting a large attenuation to providing an excellent attenuation characteristic within stopband 306EB. In the case that electronic device 301 is used as a duplexer, attenuation band 308SB is a certain frequency band exhibiting an attenuation definitely needed for the system, such as a transmission band for a reception filter in the duplexer or a reception band for a transmission filter in the duplexer. In the case that electronic device 301 is used as a high-frequency filter of a mobile communications apparatus, attenuation band 308SB is a certain frequency band exhibiting an attenuation amount definitely needed for the system, such as a reception band for a transmission filter in a duplexer or a transmission band for a reception filter in the duplexer. Amplitude characteristic 308B of auxiliary circuit 308 is designed to be similar to amplitude characteristic 306A of main circuit 306 in the attenuation band 308SB.

In electronic device 301 according to Embodiment 1, each of resonators 309 and 310 of filter 356 of main circuit 306 is an acoustic wave element including a pair of comb-shaped electrodes having interdigitated electrode fingers that utilizes acoustic waves propagating on piezoelectric substrate 302. In the case that the lowest frequency of attenuation band 308SB is higher than the highest frequency of passband 306TB, pitches between adjoining electrode fingers of IDT electrodes 313 and 314 is smaller than pitches of the electrode fingers of filter 356. In the case that the highest frequency of attenuation band 308SB is lower than the lowest frequency of passband 306TB, on the other hand, pitches between adjoining electrode fingers of IDT electrodes 313 and 314 is larger than pitches of the electrode fingers of filter 356.

FIG. 3 shows phase characteristic 306C out of the passing characteristics of main circuit 306 and phase characteristic 308D of auxiliary circuit 308 of electronic device 301. In FIG. 3, the vertical axis represents a phase, and the horizontal axis represents a frequency. As shown in FIG. 3, phase characteristic 308D of auxiliary circuit 308 is opposite to phase characteristic 306C of main circuit 306 in attenuation band 308SB. Phase characteristic 308D of auxiliary circuit 308 can be adjusted by adjusting the distance between IDT electrodes 313 and 314 that constitute the transversal filter. The opposite phase characteristic means that a difference in the phase between main signal 8306 output from main circuit 306 and auxiliary signal S308 output from auxiliary circuit 308 in response to input signal Si supplied to input terminal 303 ranges from (90+360·n) degrees to (270+360·n) degrees where n is an integer. This range causes main signal S306 output from main circuit 306 and auxiliary signal S308 output from auxiliary circuit 308 to contain phase components opposite to each other. The difference of the phase between main signal S306 and auxiliary signal S308 is ideally (180+360·n) degrees. However, any figure within the above range causes phase characteristic 308D of auxiliary circuit 308 to be opposite to phase characteristic 306C of main circuit 306, and causes amplitude characteristic 308B of auxiliary circuit to cancel amplitude characteristic 306A in attenuation band 3088B of main circuit 306 shown in FIG. 2, hence increasing the attenuation amount of electronic device 301 in attenuation band 308SB.

FIG. 4 shows amplitude characteristic 301E in an entire unit of electronic device 301 out of passing characteristics of electronic device 301, together with amplitude characteristic 306A of main circuit 306. In FIG. 4, the vertical axis represents an attenuation amount of amplitude, and the horizontal axis represents a frequency. As shown in FIG. 4, the attenuation amount of amplitude characteristic 301E of electronic device 301 is larger than that of amplitude characteristic 306A of main circuit 306 alone in attenuation band 308S.

As discussed above, electronic device 301 according to Embodiment 1 includes main circuit 306 including filter 356 that has passband 306TB and stopband 306EB, and connected between input terminal 303 and output terminal 304. Electronic device 301 further includes auxiliary circuit 308 connected in parallel to main circuit 306 between input terminal 303 and output terminal 304. Auxiliary circuit 308 has the certain frequency band (attenuation band 308SB) having amplitude characteristic 308B in attenuation band 308SB. A signal in the certain frequency band that passes auxiliary circuit 308 has a phase component opposite to a signal that passes main circuit 306. As a result, the amplitude characteristic of main circuit 306 is canceled in the certain frequency band, consequently increasing the attenuation amount.

In electronic device 301 according to Embodiment 1, auxiliary circuit 308 includes IDT electrodes 313 and 314 disposed apart from each other by a predetermined distance along single acoustic wave path 313L. This arrangement can allow the above certain frequency band (attenuation band 308SB) to be a desired certain frequency band.

In electronic device 301 according to Embodiment 1, main signal S306 output from main circuit 306 and auxiliary signal S308 output from auxiliary circuit 308 have phase components opposite to each other by adjusting the distance between IDT electrodes 313 and 314 disposed on single acoustic wave path 313L. This configuration allows fine adjustment of the phase of auxiliary signal S308 output from auxiliary circuit 308 without a separate phase reversing function.

In electronic device 301 according to Embodiment 1, both main circuit 306 (filter 356) and auxiliary circuit 308 are implemented by acoustic wave elements. This structure can approximate changes in the passing characteristic of main circuit 306 to changes in the passing characteristic of auxiliary circuit 308 even when the ambient temperature changes, thereby reducing degradation in the attenuation characteristic attributable to changes in the temperature.

In electronic device 301 according to Embodiment 1, auxiliary circuit 308 includes elements (capacitor elements 311 and 312) for adjusting the attenuation amount. This structure can approximate amplitude of auxiliary signal S308 output from auxiliary circuit 308 to amplitude of main signal S306 output from main circuit 306 in the certain frequency band (attenuation band 308SB) having a large attenuation amount, thus providing a large attenuation amount in the stopband 308EB of electronic device 301.

The capacitances of capacitor elements 311 and 312 are smaller than the capacitances of IDT electrodes 313 and 314, and the capacitance of capacitor element 311 closer to input terminal 303 is smaller than that of capacitor element 312 closer to output terminal 304. This arrangement allows the amplitude of auxiliary signal S308 output from auxiliary circuit 308 to be equal to the amplitude of main signal S306 output from main circuit 306, thereby increasing the attenuation amount in the certain frequency band (attenuation band 308SB) to have a large attenuation amount.

Auxiliary circuit 308 of electronic device 301 according to Embodiment 1 includes an acoustic-wave element section including acoustic wave elements (IDT electrodes 313 and 314), capacitor element 311 connected between the acoustic-wave element section and input terminal 303, and capacitor element 312 connected between the acoustic-wave element section and output terminal 304. This structure can protect the acoustic-wave element section from an electric current flowing into auxiliary circuit 308, and prevent IDT electrodes 313 and 314 from damage.

In electronic device 301 according to Embodiment 1, both main circuit 306 and auxiliary circuit 308 are disposed on single piezoelectric substrate 302. This structure reduces the effect of changes in temperature upon the attenuation characteristic, and provides electronic device 301 with small degradation in the attenuation characteristic due to the changes in the temperature since both the passing characteristic of main circuit 306 and the passing characteristic of auxiliary circuit 308 change similarly in response to the change in the ambient temperature. This structure also provides electronic device 301 with a small size with excellent attenuation characteristic without increasing the size since both main circuit 306 and auxiliary circuit 308 are disposed on single piezoelectric substrate 302.

In electronic device 301 according to Embodiment 1, at least one electrode finger (313A) of electrode finger 313A of IDT electrode 313 closest to IDT electrode 314 and electrode finger 314A of IDT electrode 314 closest to IDT electrode 313 is connected to reference potential 305 in auxiliary circuit 308 shown in FIG. 1. This structure reduces the attenuation amount of auxiliary circuit 308 in passband 306TB, thereby reducing an insertion loss of electronic device 301 in the passband.

Figure 5:
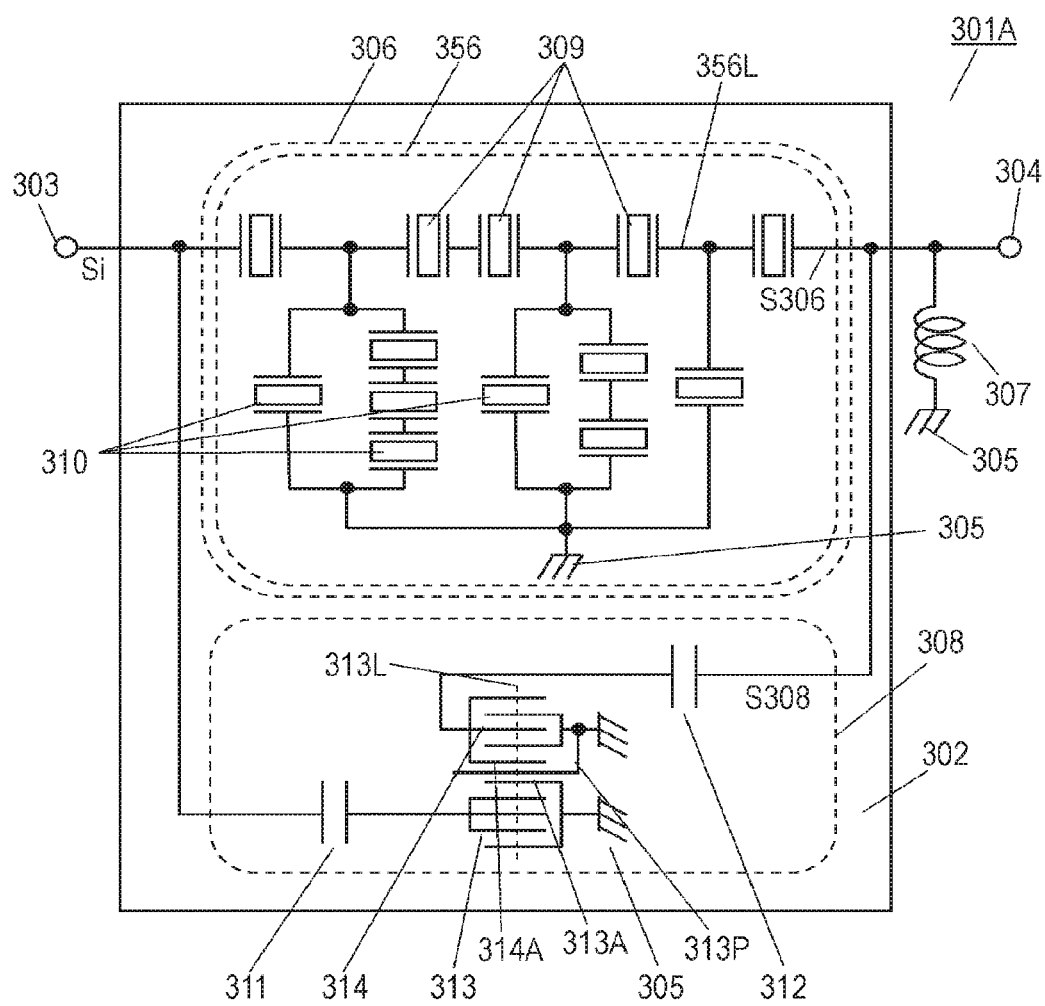
FIG. 5 is a circuit diagram of another electronic device according to Embodiment 1.

FIG. 5 is a circuit diagram of another electronic device 301A according to Embodiment 1. In FIG. 5, components identical to those of electronic device 301 shown in FIG. 1 are denoted by the same reference numerals. In electronic device 301 shown in FIG. 1, no electrode is disposed between IDT electrodes 313 and 314 of auxiliary circuit 308. In electronic device 301A shown in FIG. 5, auxiliary circuit 308 further includes shield electrode 313P which is disposed between IDT electrodes 313 and 314 and which is connected to reference potential 305. Shield electrode 313P reduces the attenuation amount of auxiliary circuit 308 in passband 306TB, thereby reducing the insertion loss of electronic device 301 in passband 306TB.

In electronic devices 301 and 301A according to Embodiment 1, both IDT electrodes 313 and 314 includes the same number of electrode fingers. However, the number of the electrode fingers of IDT electrode 313 may be different from the number of the electrode fingers of IDT electrode 314 in electronic devices 301 and 301A. This structures reduces the attenuation amount of auxiliary circuit 308 in passband 306TB, thereby reducing the insertion loss of electronic device 301 in passband 306TB.

Exemplary Embodiment 2

Figure 6:
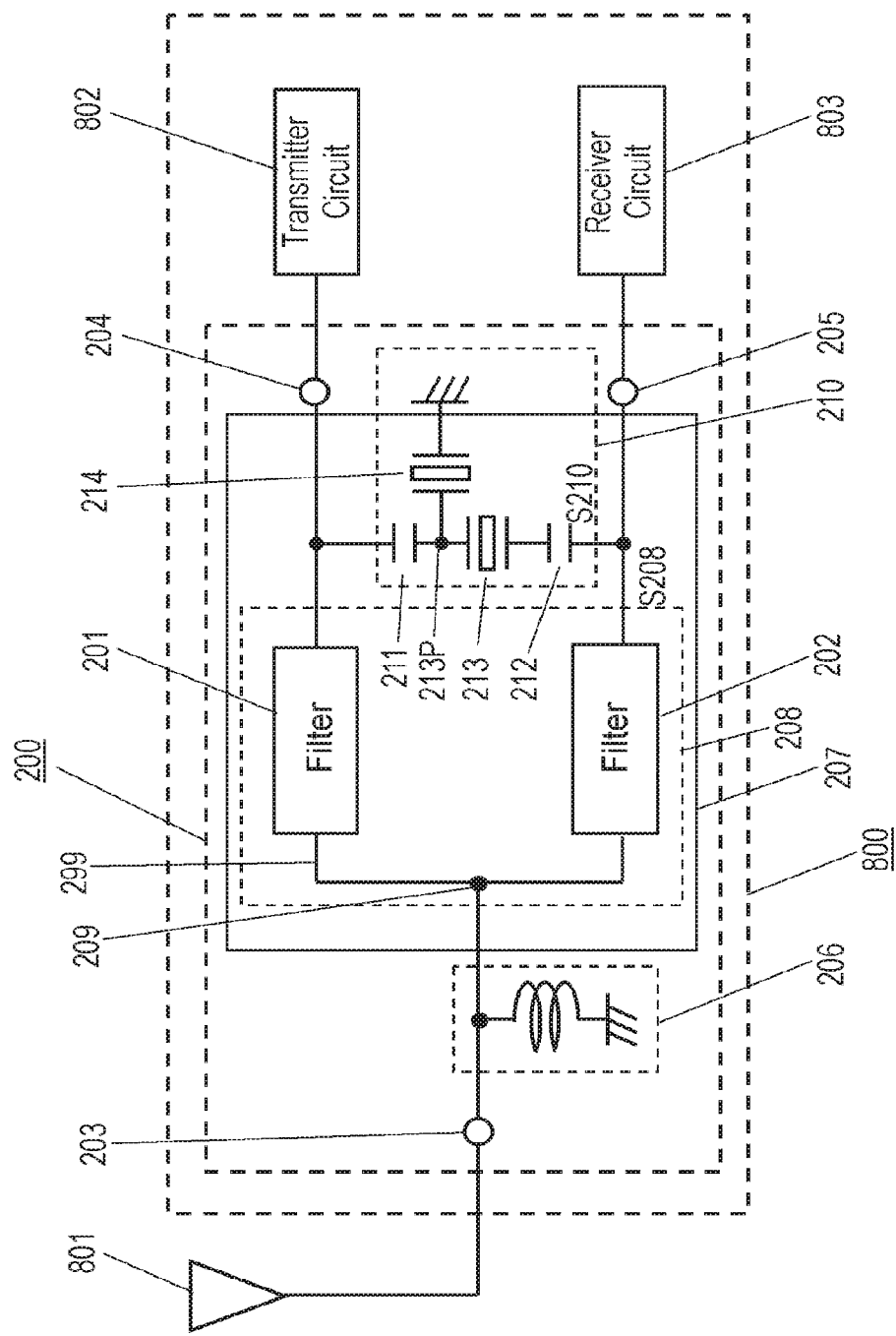
FIG. 6 is a circuit diagram of an electronic device according to Exemplary Embodiment 2 of the invention.

FIG. 6 is a circuit diagram of electronic device 200 according to Exemplary Embodiment 2 of the invention. Electronic device 200 represents an antenna duplexer configured to be mounted to communications apparatus 800.

Electronic device 200 includes filters 201 and 202, common terminal 203, input terminal 204, output terminal 205, phase shifter circuit 206 and piezoelectric substrate 207. Filters 201 and 202 are connected at node 209. Common terminal 203 is connected to node 209. Filter 201 is connected between node 209 and input terminal 204 while filter 202 is connected between node 209 and output terminal 205. Phase shifter circuit 206 is connected between node 209 and common terminal 203. Filters 201 and 202 constitute main circuit 208 connected from input terminal 204 to output terminal 205 via filter 201, node 209, and filter 202. Main circuit 208 further includes connection wiring 299 connecting filter 201 to filter 202 such that filter 202 is connected in series to filter 201 between filter 201 and output terminal 205. Common terminal 203 is connected to connection wiring 299. An isolation characteristic of electronic device 200 is a passing characteristic from input terminal 204 to output terminal 205. An excellent isolation characteristic can be obtained in passband 208TB of filter 201 and passband 208RB of filter 202 by reducing a level of signal that passes between input terminal 204 and output terminal 205. In electronic device 200, auxiliary circuit 210 is connected in parallel to main circuit 208 between input terminal 204 and output terminal 205.

Communications apparatus 800 includes electronic device 200, antenna 801, transmitter circuit 802 and receiver circuit 803. Common terminal 203 of electronic device 200 is connected to antenna 801. Input terminal 204 is connected to transmitter circuit 802. Output terminal 205 is connected to receiver circuit 803.

Figure 7:
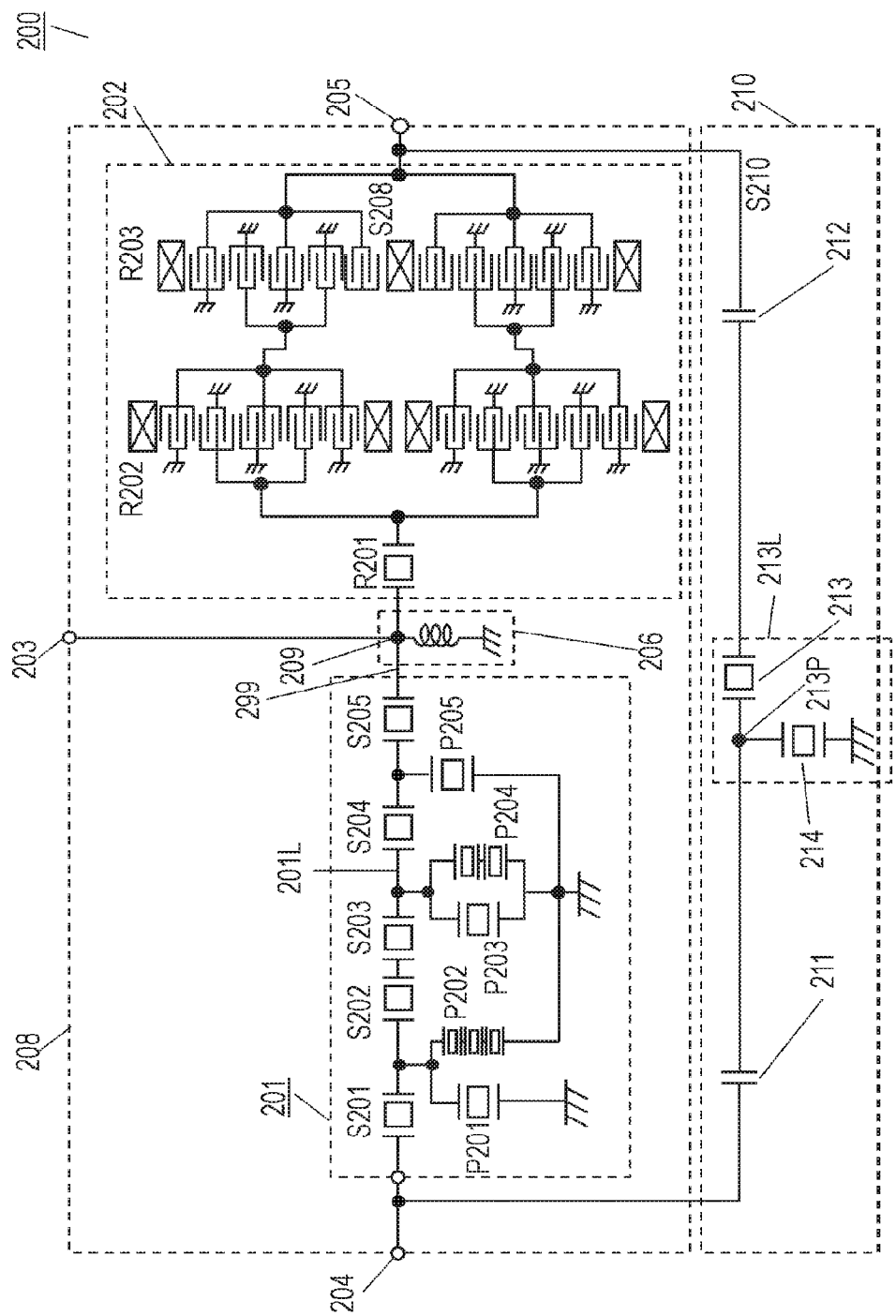
FIG. 7 is a circuit diagram of the electronic device according to Embodiment 2.
Figure 8:
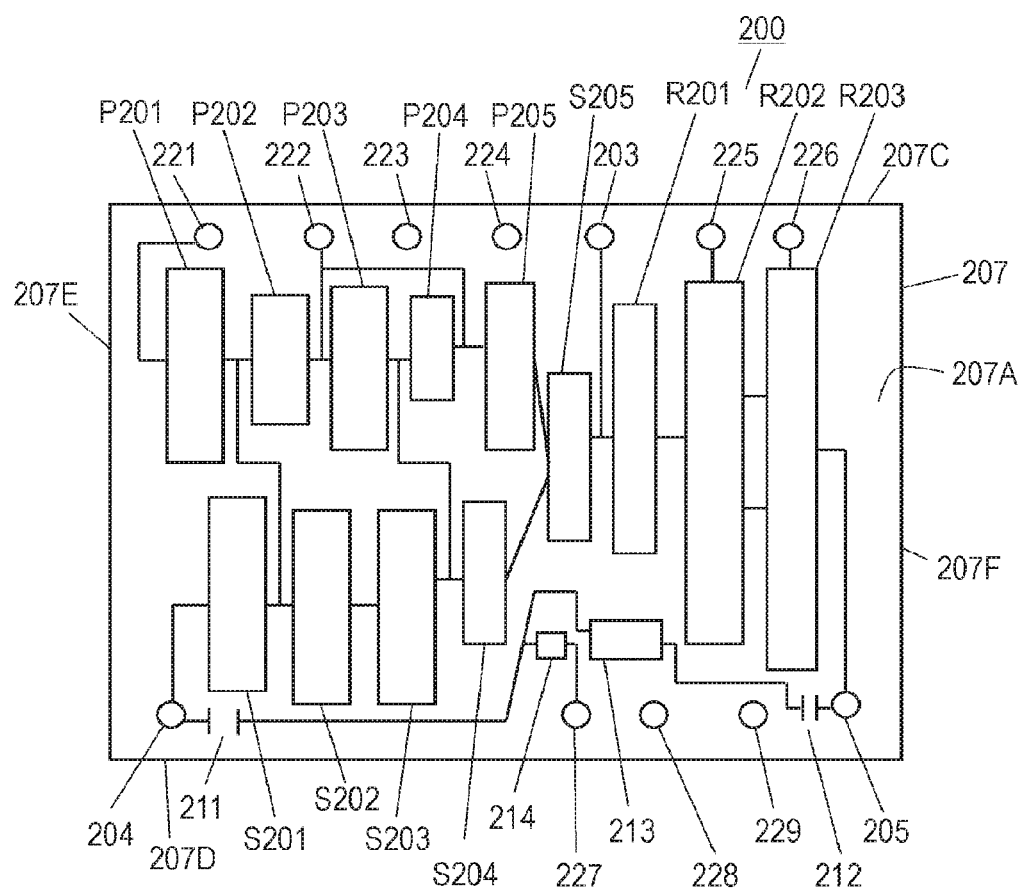
FIG. 8 is a schematic plan view of the electronic device according to Embodiment 2.

FIGS. 7 and 8 are a circuit diagram and a schematic plan view of electronic device 200, respectively. Filter 201 is implemented by a resonator including surface acoustic wave elements formed on piezoelectric substrate 207. Filter 201 has signal line 201L connected from input terminal 204 to node 209. Filter 201 includes series arm resonators S201, S202, S203, S204, and S205 and parallel arm resonators P201, P202, P203, P204, and P205. Series arm resonators S201, S202, S203, S204, and S205 are connected in series to each other in this order along signal line 201L from input terminal 204 to common terminal 203. Parallel arm resonators P201, P202, P203, P204, and P205 are connected between signal line 201L and the ground. Series arm resonators S201, S202, S203, S204, and S205, and parallel arm resonators P201, P202, P203, P204, and P205 constitute a ladder-type filter. According to Embodiment 2, passband 208TB, i.e., a transmission band, of filter 201 ranges from 880 MHz to 915 MHz. Frequencies in stopband 208EB outside of passband 208TB are lower than 880 MHz and higher than 915 MHz.

Filter 202 includes resonators including surface acoustic wave elements formed on piezoelectric substrate 207. Filter 202 includes 2-terminal resonator R201, longitudinally coupled resonator R202 and another longitudinally coupled resonator R203 that are connected in series. Passband 208RB, i.e., a reception band, of filter 202 ranges from 925 MHz to 960 MHz. Passband 208RB of filter 202 is included within stopband 208EB of filter 201. A phase of main signal S208 in main circuit 208 is inverted by determining a direction of connection of inter digital transducer (IDT) electrodes of longitudinally coupled resonator R202 or longitudinally coupled resonator R203. This arrangement allows a phase of main signal S208 output from main circuit 208 to be opposite to a phase of auxiliary signal S210 output from auxiliary circuit 210 in passband 208RB.

Auxiliary circuit 210 is connected in parallel to main circuit 208 between input terminal 204 and output terminal 205. Auxiliary circuit 210 includes capacitor elements 211 and 212 and resonators 213 and 214 implemented by electrodes formed on piezoelectric substrate 207. Resonators 213 and 214 are 2-terminal SAW resonators. Capacitor element 211, resonator 213, and capacitor element 212 are connected in series in this order between input terminal 204 and output terminal 205. Resonator 214 is connected between a ground and node 213P at which capacitor element 211 and resonator 213 are connected. That is, resonator 213 and resonator 214 as a series arm resonator and a parallel arm resonator constitute ladder circuit section 213L, respectively. Ladder circuit section 213L is connected between capacitor elements 211 and 212. Capacitor element 211 is connected between input terminal 204 and ladder circuit section 213L while capacitor element 212 is connected between output terminal 205 and ladder circuit section 213L. Capacitor element 211 is disposed closer to input terminal 204 than capacitor element 212. Capacitor element 212 is disposed closer to output terminal 205 than capacitor element 211.

In auxiliary circuit 210 according to Embodiment 2, resonator 213, the series arm resonator, has a resonance frequency of 937 MHz and an anti-resonance frequency of 917 MHz. Resonator 214, the parallel arm resonator, has a resonance frequency of 932 MHz and an anti-resonance frequency of 966 MHz. This arrangement allows auxiliary circuit 210 to have a passing characteristic for selectively passing a signal of a frequency in certain frequency band 210SB within passband 208RB, a reception band of 925 MHz to 960 MHz, inside stopband 208EB of filter 201. In other words, an attenuation amount of auxiliary circuit 210 in certain frequency band 210SB is smaller than an attenuation amount of any band other than certain frequency band 210SB. Certain frequency band 210SB according to Embodiment 2 ranges from 945 MHz to 960 MHz. Certain frequency band 210SB can be contained within passband 208RB by designing resonators 213 and 214 such that both a middle point, 951 MHz, between the resonance frequency and the anti-resonance frequency of resonator 213, the series arm resonator, and a middle point, 954 MHz, between the resonance frequency and the anti-resonance frequency of resonator 214, the parallel arm resonator, are located inside passband 208RB, i.e., the reception band of 925 MHz to 960 MHz. The middle point between the resonance frequency and the anti-resonance frequency means an average of the resonance frequency and the anti-resonance frequency. Capacitor elements 211 and 212 are the elements used to shift an amplitude amount of the passing characteristic of auxiliary circuit 210 in the certain frequency band 2108B. The amplitude of auxiliary circuit 210 in the certain frequency band 2108B can be close to the amplitude of the passing characteristic of main circuit 208 by appropriately determining the capacitances of capacitor elements 211 and 212. The phase of auxiliary signal 8210 output from auxiliary circuit 210 and the phase of main signal 8208 output from main circuit 208 in response to a signal of the frequency in certain frequency band 2108B input to input terminal 204 are opposite to each other. Accordingly, the amplitude of main signal 8208 of main circuit 208 is canceled in the certain frequency band 2108B, hence improving the isolation characteristic between input terminal 204 and output terminal 205. The phase of auxiliary signal S210 of auxiliary circuit 210 can be adjusted finely by adjusting the capacitances of capacitor elements 211 and 212. Besides, capacitor elements 211 and 212 protect resonators 213 and 214 from damage by suppressing an electric current that flows into auxiliary circuit 210 from main circuit 208. The capacitances of capacitor elements 211 and 212 are smaller than the capacitance of resonator 213. The capacitance of capacitor element 211 closer to input terminal 204 is smaller than the capacitance of capacitor element 212 closer to output terminal 205.

FIG. 8 is a schematic plan view of electronic device 200 according to Embodiment 2. Series arm resonators S201, S202, S203, S204, and S205, and parallel arm resonators P201, P202, P203, P204, and P205 that constitute filter 201, 2-terminal resonator R201, longitudinally coupled resonator R202, and longitudinally coupled resonator R203 that constitute filter 202, capacitor elements 211 and 212, and resonators 213 and 214 are formed on main surface 207A of piezoelectric substrate 207. This arrangement provides electronic device 200 with a small size and an excellent isolation characteristic by forming all the elements on single piezoelectric substrate 207 as illustrated. Piezoelectric substrate 207 has a rectangular•shape having long sides 207C and 207D opposite to each other and short sides 207E and 207F opposite to each other. Common terminal 203 is located at a position facing long side 207C of piezoelectric substrate 207. Parallel arm resonators P201, P202, P203, P204, and P205 that constitute filter 201 are arranged along long side 207C of piezoelectric substrate 207. Series arm resonators S201, S202, S203, S204, and S205 are arranged along long side 207D of piezoelectric substrate 207. In other words, parallel arm resonators P201, P202, P203, P204 and P205 are closer to long side 207C than series arm resonators S201, S202, S203, S204 and S205 are while series arm resonators S201, S202, S203, S204, and S205 are closer to long side 207D than parallel arm resonators P201, P202, P203, P204, and P205 are. Resonators 213 and 214 that constitute auxiliary circuit 210 are located at positions facing long side 207D. That is, resonators 213 and 214 are closer to long side 207D than to long side 207C. This arrangement improves the isolation characteristic of electronic device 200.

Common terminal 203 is located at a position in a direction toward filter 202 from the centers of long sides 207C and 207D of piezoelectric substrate 207 that equally divides long sides 207C and 207D. This configuration shortens the wiring on piezoelectric substrate 207 while maintaining an area occupied by the series arm resonators and the parallel arm resonators that constitute filter 201, hence providing electronic device 200 with a superior resistance to power and a low resistance loss in the wiring.

Ground terminals 221 and 222 are connected to the parallel arm resonators of filter 201. Dummy terminals 223 and 224 which are disconnected electrically from any of the resonators are disposed between common terminal 203 and ground terminals 221 and 222 on main surface 207A of piezoelectric substrate 207. This configuration prevents signals from leaking from the parallel arm resonators to common terminal 203 due to electromagnetic coupling, hence improving isolation.

Ground terminal 225 grounds a grounding electrode of longitudinally coupled resonator R202. Ground terminal 226 grounds a grounding electrode of longitudinally coupled resonator R203. Ground terminals 225 and 226 are electrically separated from each other on piezoelectric substrate 207. This configuration increases an attenuation amount of filter 202, and improves the isolation characteristic. Ground terminal 227 is connected to resonator 214.

Any of dummy terminals 223, 224, 228 and 229 is grounded, and is not connected to any of the resonators. The dummy terminals improve isolation between input terminal 204 and common terminal 203, isolation between output terminal 205 and common terminal 203, and isolation between input terminal 204 and output terminal 205, in addition to reinforcing a fixing strength of piezoelectric substrate 207.

FIGS. 9 to 13 show characteristics of electronic device 200 according to Embodiment 2.

Figure 9:
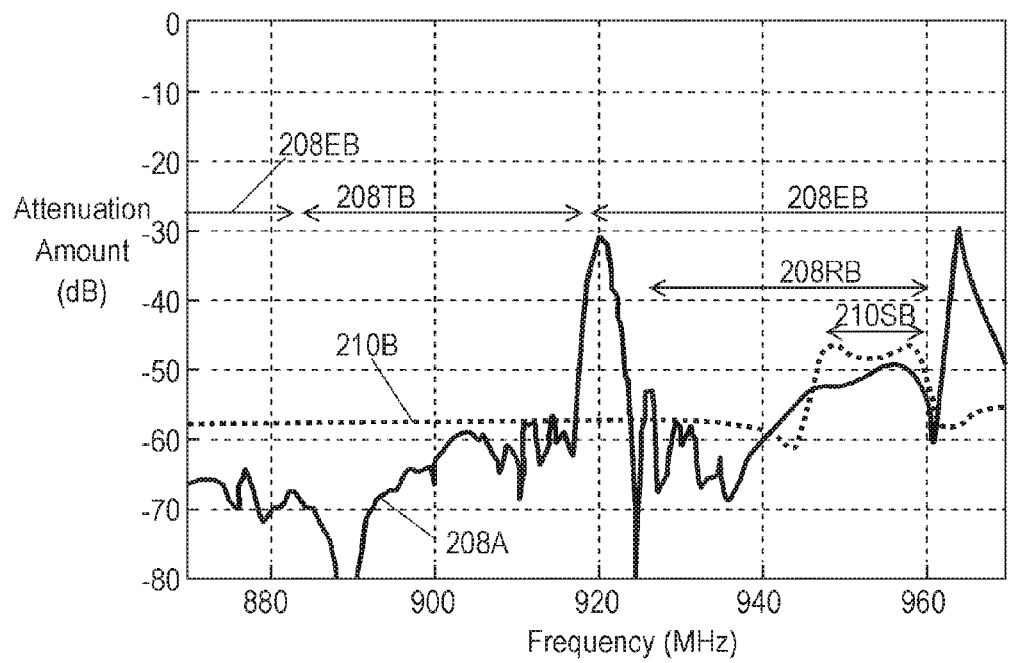

FIG. 9 shows amplitude characteristic 208A out of passing characteristics of main circuit 208 from filter 201 to filter 202 via phase shifter circuit 206, and amplitude characteristic 210B, a passing characteristic of auxiliary circuit 210 of electronic device 200. The amplitude characteristic 208A out of the passing characteristics of main circuit 208 represents an isolation characteristic of electronic device 200 not provided with auxiliary circuit 210. In FIG. 9, the vertical axis represents an attenuation amount, and the horizontal axis represents a frequency. The amplitude characteristic 210B of auxiliary circuit 210 has a passing characteristic having a rectangular shape in certain frequency band 210SB so that certain frequency band 210SB is similar to the amplitude characteristic 208A of filter 202 in passband 208RB, the reception band. The resonance frequency and the anti-resonance frequency of resonator 213, and the resonance frequency and the anti-resonance frequency of resonator 214 are arranged to cause certain frequency band 210SB to be within passband 208RB. The capacitances of capacitor elements 211 and 212 are determined so as to cause an amplitude amount of auxiliary circuit 210 in the passing characteristic to be similar to an amplitude amount in the passing characteristic of main circuit 208 in the certain frequency band 210SB.

Figure 10:
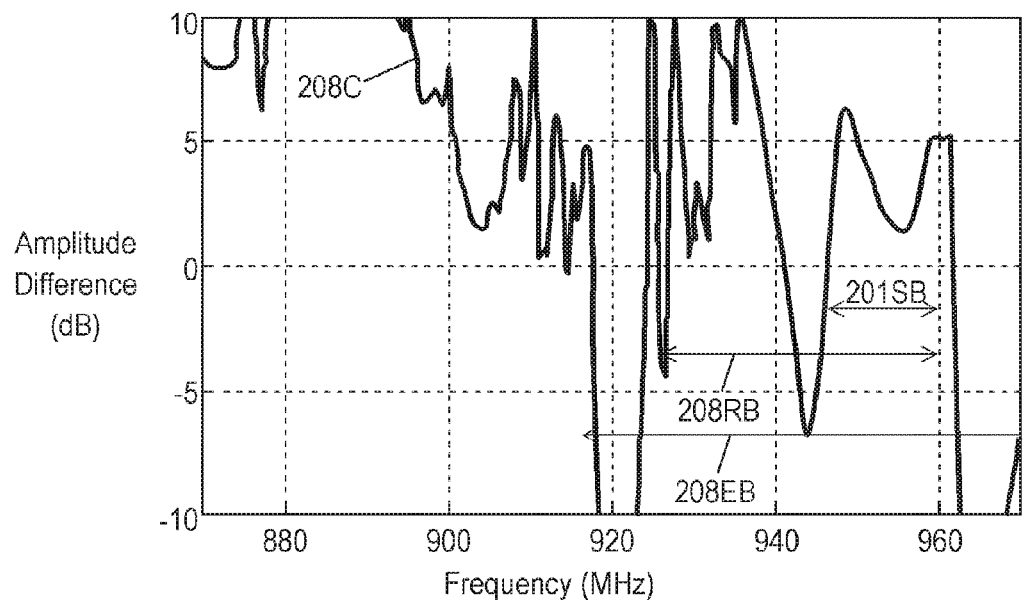

FIG. 10 shows amplitude difference 208C obtained by subtracting the attenuation amount of amplitude characteristic 208A from the attenuation amount of amplitude characteristic 210B shown in FIG. 9. In FIG. 10, the vertical axis represents an amplitude difference and the horizontal axis represents a frequency. As shown in FIG. 10, amplitude difference 208C is smaller especially in certain frequency band 210SB within passband 208RB, the reception band, than amplitude differences at other frequencies.

FIG. 11 shows phase characteristic 208D of main signal S208 passing through phase shifter circuit 206 and filter 202 from filter 201 and phase characteristic 210E of auxiliary signal S210 passing through auxiliary circuit 210. In FIG. 11, the vertical axis represents a phase and the horizontal axis represents a frequency. Phase characteristic 210E of auxiliary circuit 210 is opposite to phase characteristic 208D of main circuit 208 in certain frequency band 2108B within passband 208RB, the reception band. The opposite phase characteristic is defined as that a difference in the phases between main signal S208 output from main circuit 208 and the auxiliary signal output from auxiliary circuit 210 in response to the signal input from input terminal 204 ranges from (90+360·n) degrees to (270+360·n) degrees where n is an integer. In this range, the absolute value of phase difference 208F is not smaller than 90 degrees within a range of the phase from −180 degrees to 180 degrees, and thus, auxiliary signal S210 contain a phase component opposite to a phase component of main signal S208.

FIG. 12 shows phase difference 208F provided by subtracting phase characteristic 208D from phase characteristic 210E shown in FIG. 11. In FIG. 12, the vertical axis represents phase difference 208F and the horizontal axis represents a frequency. The absolute value of phase difference 208F is about 150 degrees which exceeds 90 degrees especially in certain frequency band 210SB within passband 208RB, the reception band.

Figure 13:
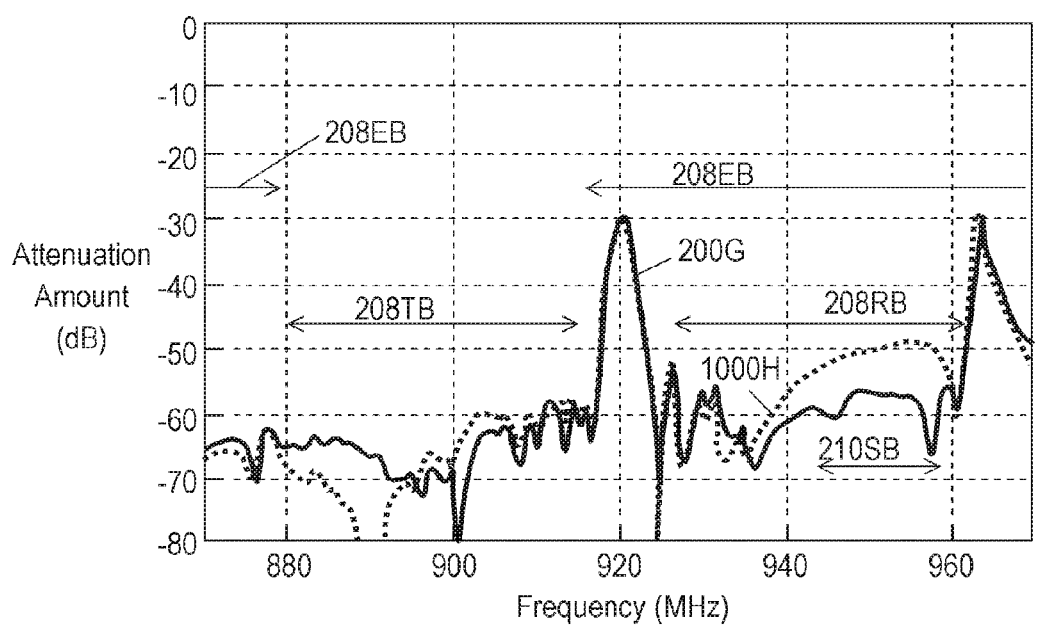

FIG. 13 shows isolation characteristic 200G of electronic device 200 according to Embodiment 2 and isolation characteristic 1000H of a comparative of an electronic device. In FIG. 13, the vertical axis represents an attenuation amount, and the horizontal axis represents a frequency. The isolation characteristic refers to a passing characteristic from input terminal 204 to output terminal 205. The larger the value of the attenuation amount in the negative direction the better the isolation characteristic is. The comparative example of the electronic device includes main circuit 208 but does not include auxiliary circuit 210, thus being equivalent to conventional electronic device 1000 shown in FIG. 29.

Isolation characteristic 200G of electronic device 200 according to Embodiment 2 reduces the signal level especially in certain frequency band 210SB within passband 208RB, and it shows a substantial improvement in the isolation characteristic as compared to the comparative example of the electronic device.

As discussed above, electronic device 200 according to Embodiment 2 includes filter 201 connected between common terminal 203 and input terminal 204, and filter 202 connected between common terminal 203 and output terminal 205. Filter 201 has passband 208TB while filter 202 has passband 208RB different from passband 208TB. Filters 201 and 202 constitute main circuit 208 from input terminal 204 to output terminal 205 via filters 201 and 202. Auxiliary circuit 210 is connected in parallel to main circuit 208 between input terminal 204 and output terminal 205. Main circuit 208 and auxiliary circuit 210 output main signal S208 and auxiliary signal 8210, respectively, in response to the signal input from input terminal 204. Either passband 208TB or passband 208RB includes certain frequency band 2108B in which auxiliary signal S210 contains a phase component opposite to a phase component in main signal S208. This arrangement cancels the amplitude of the passing characteristic of main circuit 208 in certain frequency band 210SB, hence improving the isolation characteristic between filters 201 and 202.

The absolute value of the phase difference between main signal S306 and auxiliary signal S308 is ideally 180 degrees within a range from 0 degree to 180 degrees. However, the absolute value of the phase difference not smaller than 90 degrees still improves the isolation by canceling an amplitude of the passing characteristic since auxiliary signal S210 has a phase component opposite to a phase component in main signal S208. In electronic device 200 according to Embodiment 2, the amplitude of the passing characteristic can be canceled effectively and the isolation improved more by the absolute value of the phase difference not smaller than 110 degrees, that keeps the phase difference ranging from (110+360·n) degrees to (250+360·n) degrees where n is an integer, as shown in FIG. 12.

Electronic device 200 according to Embodiment 2 includes filter 201 functioning as a transmission filter, and filter 202 functioning as a reception filter, so that electronic device 200 can function as an antenna duplexer having an excellent isolation characteristic.

In electronic device 200 according to Embodiment 2, either one of filters 201 and 202 may have a function inverting a phase. This function allows electronic device 200 not to need to include a separate phase-inverting function in auxiliary circuit 210, hence simplifying the circuit configuration of electronic device 200.

In electronic device 200 according to Embodiment 2, either one of filters 201 and 202 includes a longitudinally-coupled acoustic wave resonator. The phase of the signal output individually from main circuit 208 can be opposite to the phase of the signal output from auxiliary circuit 210 depending on a direction of connection of the IDT electrodes of the longitudinally-coupled acoustic wave resonator. This also eliminates the need to add the separate phase inverting function, thereby simplifying the circuit configuration of electronic device 200. In electronic device 200 according to Embodiment 2, auxiliary circuit 210 has includes elements (capacitor elements 211 and 212) that shift the amplitude of the passing characteristic in certain frequency band 210SB in which the phase of main signal S208 output from main circuit 208 is opposite to the phase of auxiliary signal S210 output from auxiliary circuit 210. This configuration allows the amplitude of auxiliary signal S210 to be similar to the amplitude of main signal S208 in certain frequency band 210SB.

The amplitude of auxiliary signal S210 can be equal to the amplitude of main signal 8208 in the certain frequency band 210SB especially in the case that the capacitances of capacitor elements 211 and 212 are smaller than the capacitance of resonator 213, and the capacitance of capacitor element 211 closer to input terminal 204 is smaller than that of capacitor element 212 closer to output terminal 205, hence further improving the isolation characteristic.

In electronic device 200 according to Embodiment 2, the absolute value of the difference between the amplitude of the passing characteristic of main circuit 208 and the amplitude of the passing characteristic of auxiliary circuit 210 is adjusted to be not larger than 10 dB in certain frequency band 210SB in which the phase of main signal S208 is opposite to the phase of auxiliary signal S210. This can reduce the difference in the amplitudes between main signal S208 output from main circuit 208 and auxiliary signal S210 output from auxiliary circuit 210 in certain frequency band 210SB, and thereby, more effectively cancels main signal 8208, thus further improving the isolation characteristic.

Figure 29:
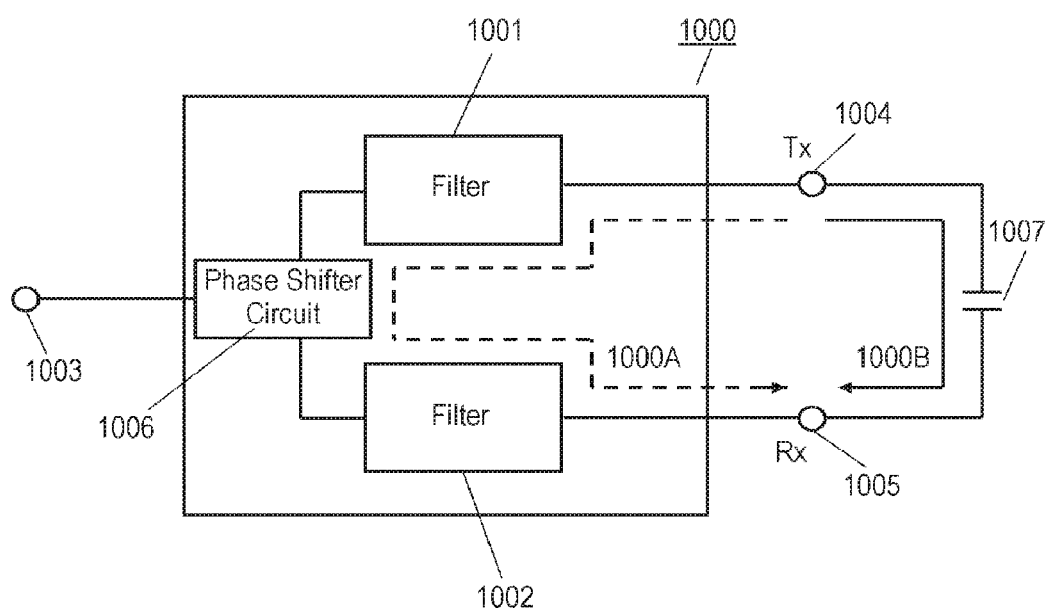
FIG. 29 is a circuit diagram of another conventional electronic device.
Figure 30:
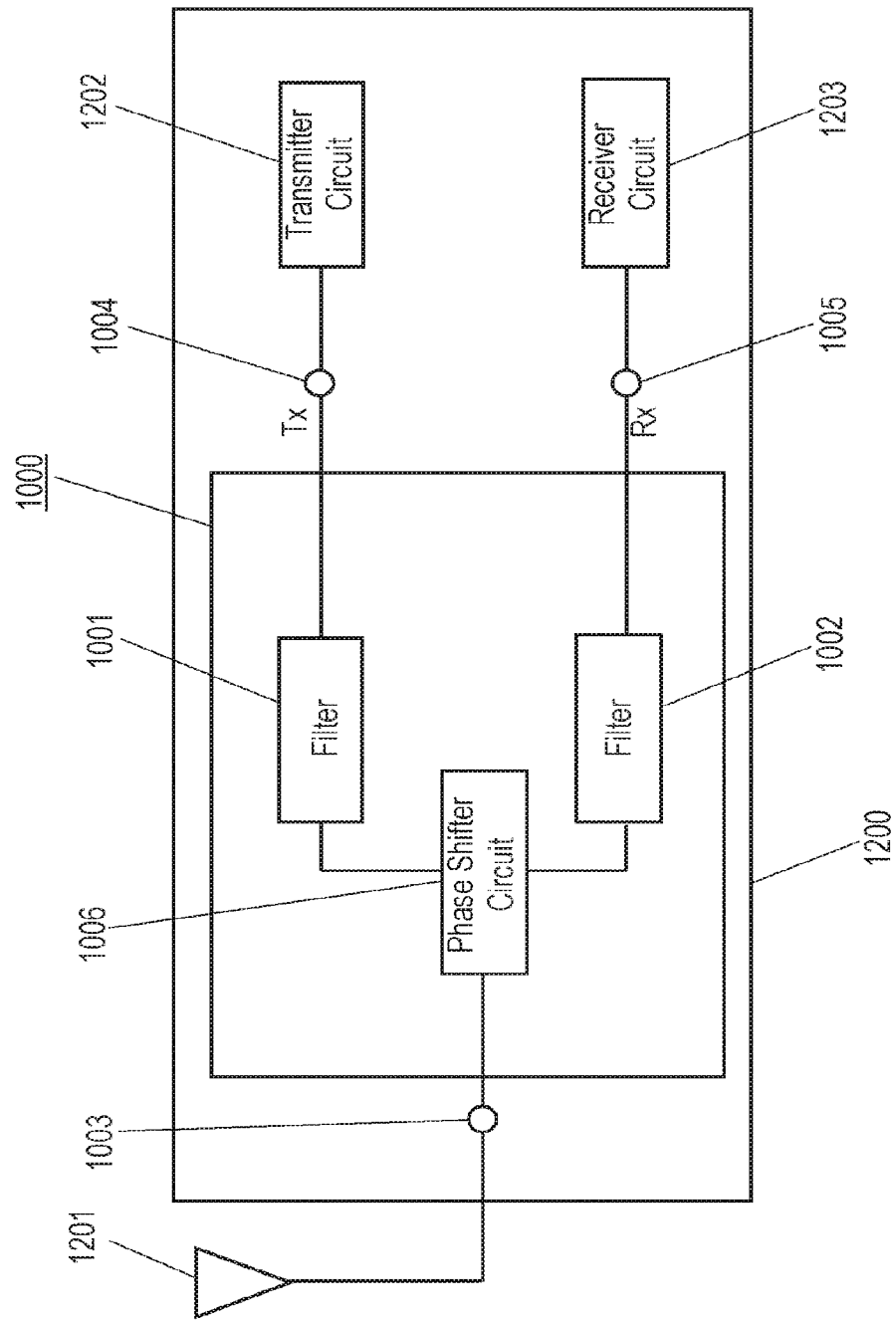
FIG. 30 is a circuit diagram of the conventional electronic device shown in FIG. 29 mounted to a radio communications apparatus.
Figure 31:
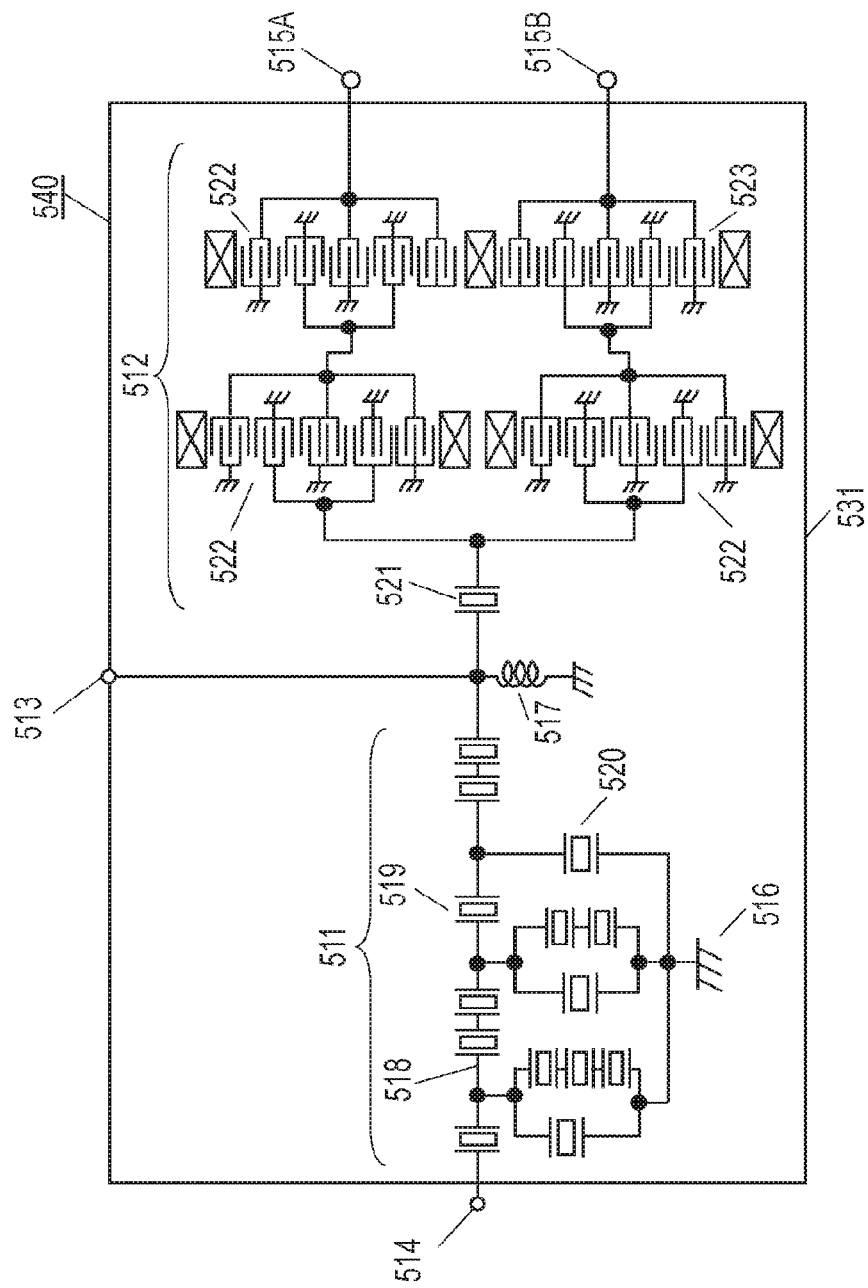
FIG. 31 is a circuit diagram of still another conventional electronic device.

In conventional electronic device 1000 shown in FIG. 29, the isolation characteristic may degrade due to ambient temperatures even though conventional electronic device 1000 has an advantage of improving the isolation characteristic. In other words, the difference of the phase changes significantly between the signals transmitted via paths 1000A and 1000B when the ambient temperature changes. This change causes the isolation characteristic to degrade since the thermal characteristic of the acoustic wave resonators constituting filter 1001 or filter 1002 is different from the thermal characteristic of capacitor element 1007.

In electronic device 200 according to Embodiment 2, each of filters 201 and 202 has a ladder circuit section including acoustic wave elements (resonators S201 to S205 and P201 to P205) while auxiliary circuit 210 includes ladder circuit section 213L including acoustic wave elements. This configuration allows a change in the frequency characteristic of the ladder circuit section in filters 201 and 202 to be similar to a change in the frequency characteristic of the ladder circuit section 213L of auxiliary circuit 210 even when the temperature changes, thereby reducing degradation in the isolation characteristic due to the temperature changes.

In electronic device 200 according to Embodiment 2, auxiliary circuit 210 includes ladder circuit section 213L using acoustic wave elements. Auxiliary circuit 210 further includes capacitor element 211 connected between ladder circuit section 213L and input terminal 204, and capacitor element 212 connected between ladder circuit section 213L and output terminal 205. This structure can protect resonators 213 and 214 from an electric current flowing from main circuit 208, and prevent resonators 213 and 214 from damage.

In electronic device 200 according to Embodiment 2, auxiliary circuit 210 includes ladder circuit section 213L including series arm resonator 213 and parallel arm resonator 214. Both a middle point between the resonance frequency and the anti-resonance frequency of series arm resonator 213 and another middle point between the resonance frequency and the anti-resonance frequency of parallel arm resonator 214 are located within either passband 208TB or passband 208RB. This arrangement allows certain frequency band 210SB which is the passband of auxiliary circuit 210 to be within passband 208TB or 208RB.

In electronic device 200 according to Embodiment 2, auxiliary circuit 210 and at least one of filters 201 and 202 include acoustic wave elements formed on single piezoelectric substrate 207. This structure can reduce degradation in the isolation characteristic even when the temperature changes since changes in the frequency characteristic due to the changes in the temperature is produced on both of one of filters 201 and 202 as well as auxiliary circuit 210. Electronic device 200 can hence function as an antenna duplexer having a small degradation in the isolation characteristic due to the temperature change. This structure can also provide electronic device 200 with excellent isolation characteristic without increasing its size since auxiliary circuit 210 and at least one of filters 201 and 202 are formed on single piezoelectric substrate 207.

Electronic device 200 according to Embodiment 2 is an antenna duplexer, but may be, e.g. a dual filter. In other words, electronic device 200 can provide a similar advantage even if it is applied to any circuit including two filters connected to a single common terminal.

In electronic device 200 according to Embodiment 2, filters 201 and 202 and resonators 213 and 214 are implemented by surface acoustic wave filters and surface acoustic wave resonators. Filters 201 and 202 and resonators 213 and 214 may be implemented by boundary acoustic wave filters and boundary acoustic wave resonators, similarly improving the isolation characteristic.

Exemplary Embodiment 3

Figure 14:
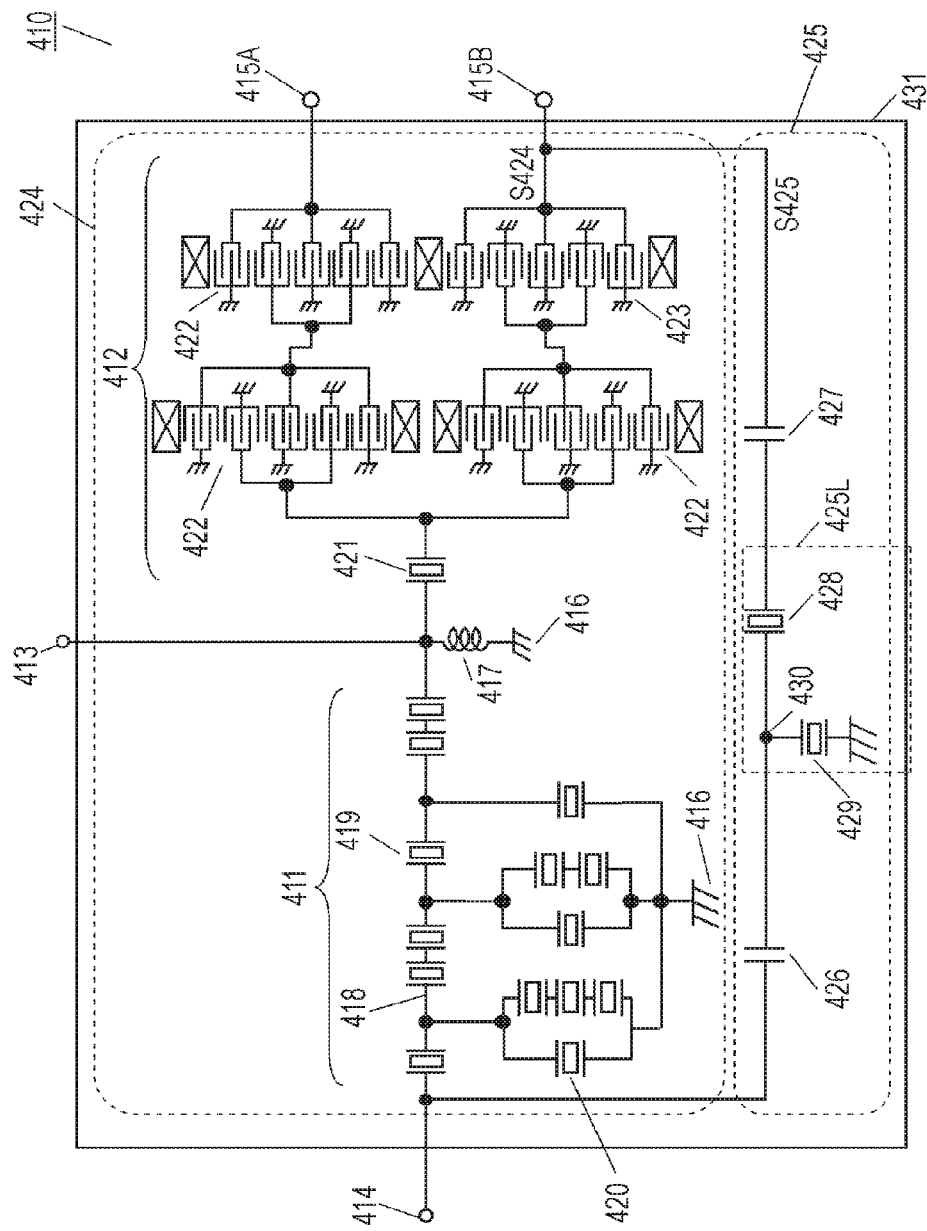
FIG. 14 is a circuit diagram of an electronic device according to Exemplary Embodiment 3 of the invention.

FIG. 14 is a circuit diagram of electronic device 410 according to Exemplary Embodiment 3 of the present invention. Electronic device 410 is a high-frequency filter used as an antenna duplexer in a radio communications apparatus. Electronic device 410 includes filters 411 and 412, common terminal 413, unbalanced input terminal 414, a pair of balanced output terminals 415A and 415B, ground 416, and inductor 417. Filter 411 and filter 412 function as a transmission filter and a reception filter of the antenna duplexer, respectively. Common terminal 413 is configured to be connected to an antenna.

Filter 411 has signal line 418 connected between common terminal 413 and input terminal 414. Filter 411 includes series arm resonators 419 connected in series to each other along signal line 418 between common terminal 413 and input terminal 414. Filter 411 further includes parallel arm resonators 420 connected between signal line 418 and ground 416. Series arm resonators 419 and parallel arm resonators 420 constitute a ladder-type filter.

Filter 412 includes one 2-terminal resonator 421, three non-inverting type longitudinally coupled resonators 422 and one inverting type longitudinally coupled resonator 423 that are connected between common terminal 413 and each of the pair of output terminals 415A and 415B, and constitute a band-pass filter having an unbalanced-to-balanced converting function. In non-inverting type longitudinally coupled resonator 422, electrode fingers of an input side comb-shaped electrode and electrode fingers of an output side comb-shaped electrode are disposed in the relation of same phase. In inverting type longitudinally coupled resonator 423, electrode fingers of an input side comb-shaped electrode and electrode fingers of an output side comb-shaped electrode are disposed in the relation of opposite phases.

Passband 424TB, a transmission band, of filter 411 ranges from 880 MHz to 915 MHz. Stopband 424EB outside of passband 424TB has frequencies lower than 880 MHz and higher than 915 MHz. Passband 424RB, a reception band, of filter 412 ranges from 925 MHz to 960 MHz, and is within stopband 424EB of filter 411. Series arm resonators 419, parallel arm resonators 420, 2-terminal resonator 421, and four longitudinally coupled resonators 422 and 423 are implemented by surface acoustic wave elements formed on piezoelectric substrate 431. Series arm resonators 419, parallel arm resonators 420, and non-inverting type longitudinally coupled resonators 422 may individually have different design parameters.

In electronic device 410, filters 411 and 412 constitute main circuit 424 connected from input terminal 414 to the pair of output terminals 415A and 415B via filters 411 and 412. Electronic device 410 further includes auxiliary circuit 425 connected in parallel to main circuit 424 between input terminal 414 and output terminal 415B to which inverting type longitudinally coupled resonator 423 is connected. Auxiliary circuit 425 has certain frequency band 425SB in which a phase characteristic is opposite to the phase of main circuit 424 connected between input terminal 414 and output terminal 415B. Certain frequency band 425SB is within passband 424RB.

Auxiliary circuit 425 includes capacitor elements 426 and 427 and resonators 428 and 429. Resonators 428 and 429 are 2-terminal surface acoustic wave resonators formed on piezoelectric substrate 431 similar to the acoustic wave elements of main circuit 424. Capacitor elements 426 and 427 are implemented by electrodes formed on piezoelectric substrate 431. Capacitor element 426, resonator 428, and capacitor element 427 are connected in series in this order from input terminal 414 to output terminal 415B. Resonator 429 is connected between ground 416 and node 430 at which capacitor element 426 are connected to resonator 428. Resonators 428 and 429 constitute ladder circuit section 425L in which resonator 428 and resonators 429 function as a series arm resonator and a parallel arm resonator, respectively. Ladder circuit section 425L is connected between capacitor elements 426 and 427. Capacitor element 426 is disposed closer to input terminal 414 than capacitor element 427 is while capacitor element 427 is closer to output terminal 415B than capacitor element 426 is. Capacitor element 426 is connected between input terminal 414 and ladder circuit section 425L while capacitor element 427 is connected between output terminal 415B and ladder circuit section 425L.

In electronic device 410 according to Embodiment 3, a resonance frequency and an anti-resonance frequency of resonator 428, the series arm resonator, of auxiliary circuit 425 are 937 MHz and 917 MHz, respectively. A resonance frequency and an anti-resonance frequency of resonator 429, the parallel arm resonator, are 932 MHz and 966 MHz, respectively. This arrangement allows auxiliary circuit 425 to have certain frequency band 425SB, which is a passband for selectively passing a signal, within passband 424RB (925 MHz-960 MHz) of filter 412 in stopband 424EB of filer 411. In other words, an attenuation amount of auxiliary circuit 425 in certain frequency band 425SB is smaller than an attenuation amount of any band other than certain frequency band 425SB. Certain frequency band 425SB according to Embodiment 3 ranges from 945 MHz to 960 MHz. Capacitor elements 426 and 427 are elements for adjusting the attenuation amount of the amplitude of auxiliary circuit 425 in certain frequency band 425SB. The capacitances of capacitor elements 426 and 427 are appropriately determined to allow the attenuation amount of auxiliary circuit 425 in certain frequency band 425SB to be similar to the attenuation amount of main circuit 424. In certain frequency band 425SB, main signal S424 output from main circuit 424 and auxiliary signal S425 output from auxiliary circuit 424 in response to input signal Si input from input terminal 414 contain phase components opposite to each other. Accordingly, the amplitude of auxiliary signal 8425 output from auxiliary circuit 425 cancels the amplitude of main signal S424 output from main circuit 424, hence improving the isolation characteristic between input terminal 414 and output terminal 415B. The phase of auxiliary signal S425 of auxiliary circuit 425 can be adjusted finely with the capacitances of capacitor elements 426 and 427. Capacitor elements 426 and 427 suppress an electric current that flows into auxiliary circuit 425 from main circuit 424 so as to protect resonators 428 and 429 from damage. Specifically, the capacitances of capacitor elements 426 and 427 are smaller than the capacitance of resonator 428, and the capacitance of capacitor element 426 closer to input terminal 414 is smaller than the capacitance of capacitor element 427 closer to output terminal 415B.

Electronic device 410 includes auxiliary circuit 425 reducing a level of the signal that passes between input terminal 414 and output terminal 415B in certain frequency band 425SB, hence exhibiting an excellent isolation characteristic.

Electrical characteristics of electronic device 410 according to Embodiment 3 will be detailed below.

Figure 15:
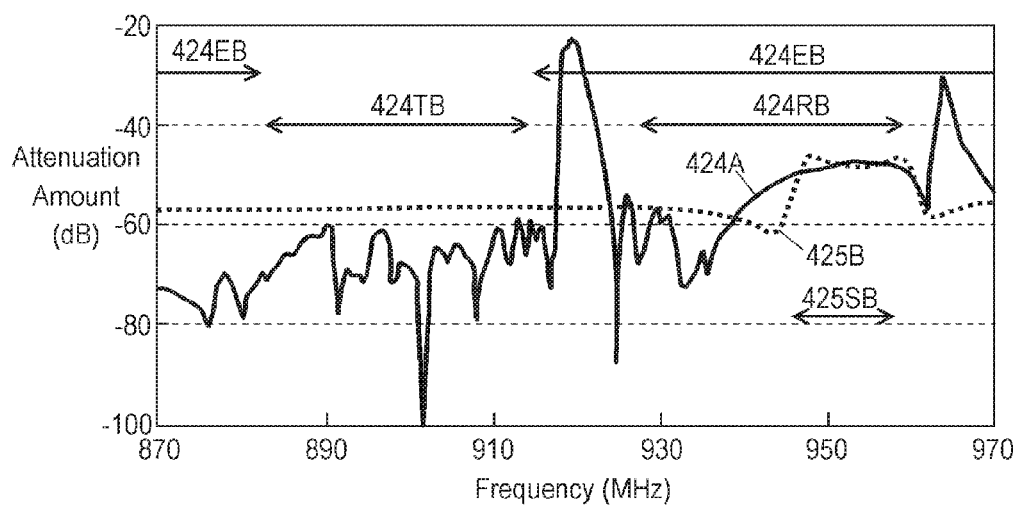
FIGS. 15 to 19 are characteristic charts of the electronic device according to Embodiment 3.

FIG. 15 shows amplitude characteristic 424A out of passing characteristics of main circuit 424 from input terminal 414 to output terminal 415B in the case that electronic device 410 does not include auxiliary circuit 425. In FIG. 15, the vertical axis represents an attenuation amount, and the horizontal axis represents a frequency. Amplitude characteristic 424A represents an isolation characteristic of electronic device 410 from input terminal 414 to output terminal 415B which does not include auxiliary circuit 425. FIG. 15 also shows amplitude characteristic 425B that is a passing characteristic of auxiliary circuit 425. The amplitude characteristic 425B of auxiliary circuit 425 has a passing characteristic having a rectangular shape in which an attenuation amount is small in certain frequency band 424SB and the attenuation amount is large outside certain frequency band 425SB, so as to allow The amplitude characteristic 425B of auxiliary circuit 425 to be similar to the amplitude characteristic 424A in passband 424RB. Certain frequency band 425SB can be designed to be within passband 424RB by adjusting the resonance frequency and the anti-resonance frequency of resonator 428 and the resonance frequency and the anti-resonance frequency of resonator 429. The attenuation amount of the amplitude characteristic of auxiliary circuit 425 in certain frequency band 425SB is designed to be similar to the attenuation amount of the amplitude characteristic of main circuit 424 in certain frequency band 425SB by adjusting the capacitances of capacitor elements 426 and 427.

Figure 16:
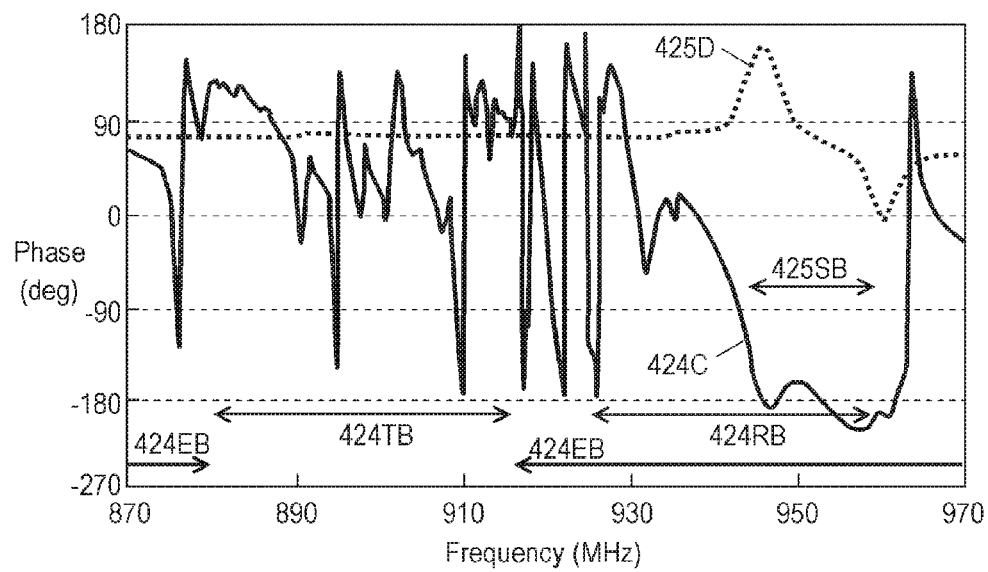

FIG. 16 shows phase characteristic 424C of main circuit 424 alone from input terminal 414 to output terminal 415B in the case that electronic device 410 does not include auxiliary circuit 425. FIG. 16 also shows phase characteristic 425D of auxiliary circuit 425. In FIG. 16, the vertical axis represents a phase, and the horizontal axis represents a frequency. As shown in FIG. 16, phase characteristic 425D of auxiliary circuit 425 is opposite to phase characteristic 424C of main circuit 424 in certain frequency band 425SB within passband 424RB in stopband 424EB. The opposite phase characteristic is defined as that a difference in the phases between main signal S424 output from main circuit 424 in response to a signal input from input terminal 414 without auxiliary circuit 425 and auxiliary signal S425 output from auxiliary circuit 425 in response to the same signal input from input terminal 414 ranges from −180 degrees to 180 degrees, and the absolute value of the difference in the phase is not smaller than 90 degrees. In other words, the difference in the phases between main signal S424 and auxiliary signal S425 ranges from (90+360·n) degrees to (270+360·n) degrees where n is an integer. Under this condition, main signal S424 and auxiliary signal S425 have vector components having directions opposite to each other when the phases of these signals are shown with vectors.

Figure 17:
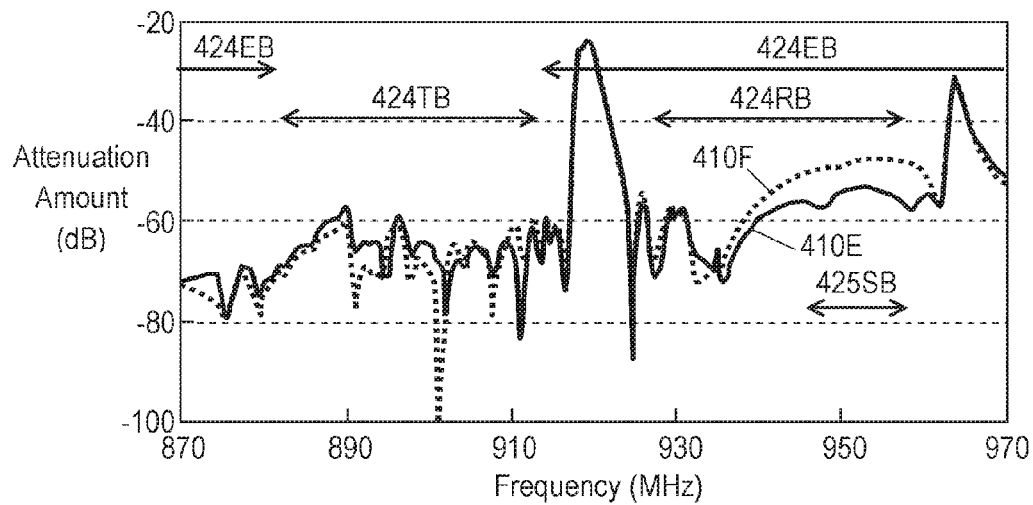

FIG. 17 shows amplitude characteristic 410E that is a passing characteristic under a balancing operation of electronic device 410 including main circuit 424 and auxiliary circuit 425 from input terminal 414 to output terminals 415A and 415B. In FIG. 17, the vertical axis represents an attenuation amount, and the horizontal axis represents a frequency. Amplitude characteristic 410E represents an isolation characteristic of electronic device 410. FIG. 17 also shows amplitude characteristic 410F that is a passing characteristic of main circuit 424 alone across filters 411 and 412 of electronic device 410. Amplitude characteristic 410F represents an isolation characteristic of electronic device 410 in the case that electronic device 410 does not include auxiliary circuit 425. As shown in FIG. 17, amplitude characteristic 410E representing the isolation characteristic of electronic device 410 exhibits a larger attenuation amount especially in certain frequency band 425SB in passband 424RB than amplitude characteristic 410F representing the isolation characteristic of main circuit 424 alone, thus showing that the isolation characteristic of electronic device 410 is improved by auxiliary circuit 425.

Figure 18:
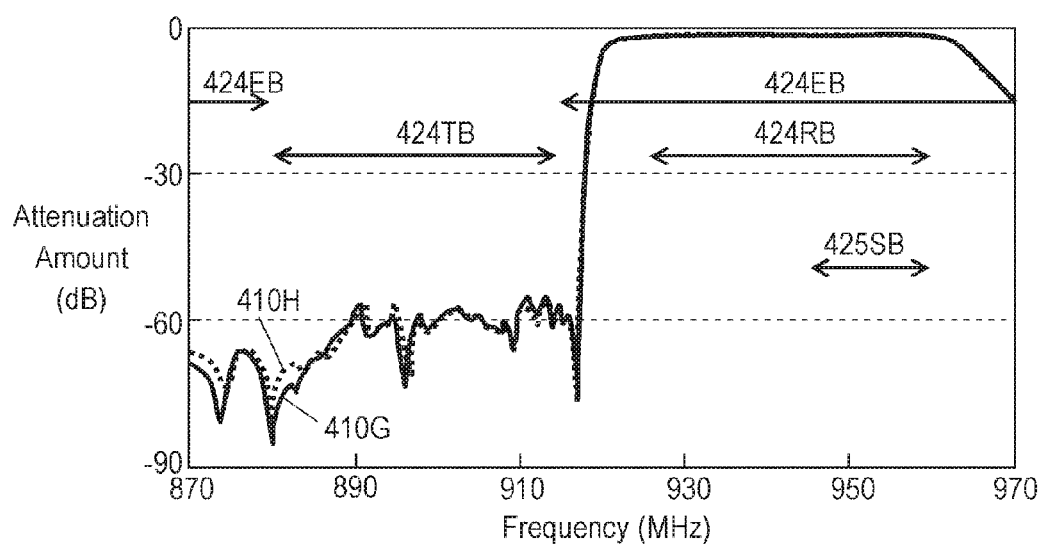

FIG. 18 shows amplitude characteristic 410G that is a passing characteristic under an balanced operation of electronic device 410 including auxiliary circuit 425 from input terminal 414 to output terminals 415A and 415B. In FIG. 18, the vertical axis represents an attenuation amount, and the horizontal axis represents a frequency. Amplitude characteristic 410G is a passing characteristic of filter 412 in the case that auxiliary circuit 425 is included. FIG. 18 also shows amplitude characteristic 410H that is a passing characteristic under a balanced operation of electronic device 410 from common terminal 413 to output terminals 415A and 415B in the case that auxiliary circuit 425 is not included. Amplitude characteristic 410H represents the passing characteristic of filter 412 in the case that auxiliary circuit 425 is not included. As shown in FIG. 18, amplitude characteristic 410G with auxiliary circuit 425 has a larger attenuation amount in a range from 880 MHz to 885 MHz than amplitude characteristic 410H without auxiliary circuit 425, thus providing an improvement of the isolation in passband 424TB. Amplitude characteristic 410G with auxiliary circuit 425 and amplitude characteristic 410H without auxiliary circuit 425 have substantially the same attenuation amount in passband 424RB, as shown in FIG. 18. Thus, auxiliary circuit 425 does not influence the passing characteristic of filter 412 in passband 424RB.

Figure 19:
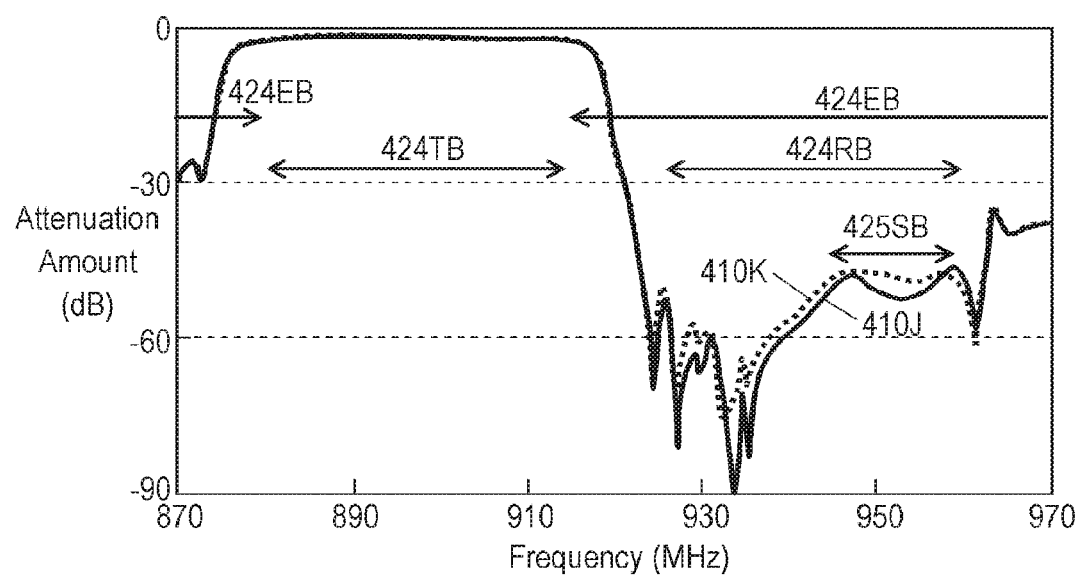

FIG. 19 shows amplitude characteristic 410J that is a passing characteristic of electronic device 410 including auxiliary circuit 425 from input terminal 414 to common terminal 413. In FIG. 19, the vertical axis represents an attenuation amount, and the horizontal axis represents a frequency. Amplitude characteristic 410J represents an amplitude characteristic that is a passing characteristic of filter 411 in the case that electronic device 410 includes auxiliary circuit 425. FIG. 19 also shows amplitude characteristic 410K that is a passing characteristic of electronic device 410 from input terminal 414 to common terminal 413 in the case that electronic device 410 does not include auxiliary circuit 425. Amplitude characteristic 410K represents an amplitude characteristic that is a passing characteristic of filter 411 in the case that auxiliary circuit 425 is not included. As shown in FIG. 19, amplitude characteristic 410J with auxiliary circuit 425 has a larger attenuation amount in passband 424RB than amplitude characteristic 410K without auxiliary circuit 425, thus improving the isolation in passband 424RB. Amplitude characteristic 410J with auxiliary circuit 425 and amplitude characteristic 410K without auxiliary circuit 425 have substantially the same attenuation amount in passband 424TB, as shown in FIG. 19. Thus, auxiliary circuit 425 does not influence the passing characteristic of filter 411 in passband 424TB.

As discussed above, electronic device 410 according to Embodiment 3 includes unbalanced common terminal 413, unbalanced input terminal 414, a pair of balanced output terminals 415A and 415B, filter 411 having passband 424TB, and filter 412 connected between output terminals 415A and 415B and common terminal 413. Filter 411 has passband 424TB. Filter 412 has passband 424RB different from passband 424TB. Filters 411 and 412 constitute main circuit 424 connected from input terminal 414 to output terminals 415A and 415B via filters 411 and 412. Auxiliary circuit 425 is connected in parallel to main circuit 424 between output terminal 415B and input terminal 414. Auxiliary circuit 425 has certain frequency band 425SB containing a phase characteristic opposite to a phase characteristic of main circuit 424 in either passband 424TB or passband 424RB. This configuration cancels the amplitude of the passing characteristic of main circuit 424 in certain frequency band 425SB, hence improving significantly the isolation characteristic between filters 411 and 412.

In electronic device 410 according to Embodiment 3, filter 411 functions as a transmission filter, and filter 412 functions as a reception filter. Electronic device 410 can thus function as an antenna duplexer having an excellent isolation characteristic.

In electronic device 410 according to Embodiment 3, auxiliary circuit 425 includes elements (capacitor elements 426 and 427) that shift the attenuation amount of the passing characteristic in certain frequency band 425SB. This configuration allows the amplitude of auxiliary signal S425 output from auxiliary circuit 425 to be similar to the amplitude of main signal S424 output from main circuit 424 in certain frequency band 425SB. In particular, the capacitances of capacitor elements 426 and 427 are smaller than the capacitance of resonator 428, and the capacitance of capacitor element 426 closer to input terminal 414 is smaller than that of capacitor element 427 closer to output terminal 415B. This arrangement allows the amplitude of auxiliary signal S425 of auxiliary circuit 425 to match the amplitude of main signal S424 of main circuit 424 in the certain frequency band 425SB, further improving the isolation characteristic.

In electronic device 410 according to Embodiment 3, filter 412 includes non-inverting type longitudinally coupled resonators 422 connected to output terminal 415A, and inverting type longitudinally coupled resonator 423 connected to output terminal 415B. Auxiliary circuit 425 is connected to output terminal 415B to which inverting type longitudinally coupled resonator 423 is connected. This structure allows the phase of auxiliary signal S425 of auxiliary circuit 425 to be opposite to the phase of main signal S424 of main circuit 424, thereby providing an excellent isolation characteristic. This structure can eliminate an additional separate phase reversing function to auxiliary circuit 425, thus simplifying the circuit configuration of electronic device 410.

In electronic device 410 according to Embodiment 3, auxiliary circuit 425 includes ladder circuit section 425L implemented by acoustic wave elements. Capacitor element 426 is connected between ladder circuit section 425L and input terminal 414. Capacitor element 427 is connected between ladder circuit section 425L and output terminal 415B. Capacitor elements 426 and 427 protect resonators 428 and 429 from an electric current flowing from main circuit 424, and prevent resonators 428 and 429 from damage.

In electronic device 410 according to Embodiment 3, filters 411 and 412 and auxiliary circuit 425 are implemented by acoustic wave elements formed on the single piezoelectric substrate. This structure can reduce degradation in the isolation characteristic even when a temperature changes since changes in the frequency characteristic due to the temperature change occur on both auxiliary circuit 425 and at least one of filters 411 and 412 as well. Electronic device 410 can function as a high-frequency filter having small degradation in the isolation characteristic to the temperature changes. This structure in which filters 411 and 412 and auxiliary circuit 425 are formed on the single same piezoelectric substrate provides the high-frequency filter with a small size and excellent isolation characteristic.

In electronic device 410 according to Embodiment 3, filters 411 and 412 and resonator 428 are implemented by surface acoustic wave filters and a surface acoustic wave resonator. Filters 411 and 412 and resonator 428 may be implemented by boundary acoustic wave filters and a boundary acoustic wave resonator, improving the isolation characteristic similar to electronic device 410 according to Embodiment 3.

In electronic device 410 according to Embodiment 3, the isolation in passband 424RB is improved by allocating certain frequency band 425SB inside passband 424RB of filter 412 used as a reception filter. Similarly, the isolation in passband 424TB can be improved by allocating certain frequency band 425SB inside passband 424TB of filter 411 used as a transmission filter.

In electronic device 410 shown in FIG. 14, inductor 417 is disposed on piezoelectric substrate 431, but may be located outside piezoelectric substrate 431.

In electronic device 410 according to Embodiment 3, the resonance frequency and the anti-resonance frequency of resonator 428 and the resonance frequency and the anti-resonance frequency of resonator 429 are determined such that certain frequency band 425SB is within passband 424RB. The advantages discussed above can be obtained by allocating certain frequency band 425SB within passband 424RB. To be specific, certain frequency band 425SB is within passband 424RB and the above advantages can be obtained in the case that one of the resonance frequency of resonator 428 and the anti-resonance frequency of resonator 429 is within passband 424RB.

Each of resonators 428 and 429 is a one-stage ladder type circuit, but may be two or more-stage ladder type circuit.

The relation between passband 424TB, the transmission band, of filter 411 and passband 424RB, the reception band, of filter 412 is only illustrative and not restrictive.

Exemplary Embodiment 4

Figure 20:
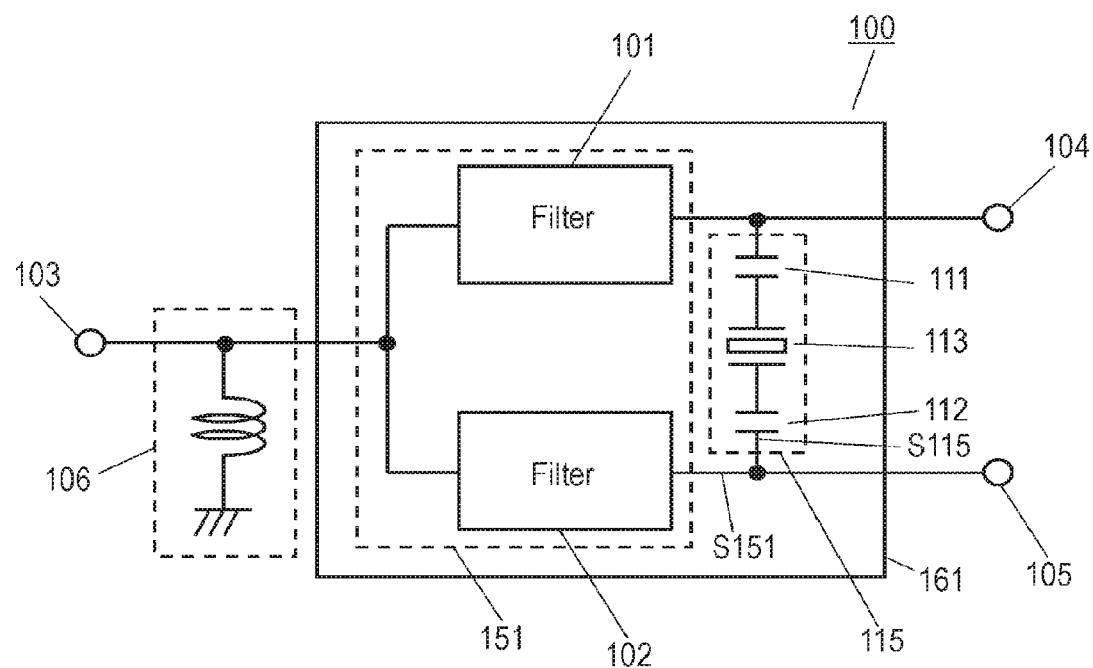
FIG. 20 is a circuit diagram of an electronic device according to Exemplary Embodiment 4 of the invention.

FIG. 20 is a circuit diagram of electronic device 100 according to Exemplary Embodiment 4 of the present invention. Electronic device 100 functions as an antenna duplexer. Electronic device 100 includes filters 101 and 102, common terminal 103, input terminal 104, and output terminal 105. Filters 101 and 102 are formed on single piezoelectric substrate 161. Filter 101 functions as a transmission filter of the antenna duplexer, and filter 102 functions as a reception filter of the antenna duplexer.

Filter 101 is implemented by a surface acoustic wave filter including a surface acoustic wave resonator connected between common terminal 103 and input terminal 104, and has passband 151TB that is a transmission band ranging from 880 MHz to 915 MHz and stopband 151EB outside passband 151TB. Filter 102 is implemented by a surface acoustic wave filter including a surface acoustic wave resonator connected between common terminal 103 and output terminal 105, and has passband 151RB that is a reception band ranging from 925 MHz to 960 MHz. Passband 151RB of filter 102 is within stopband 151EB of filter 101. Electronic device 100 that functions as an antenna duplexer is configured such that common terminal 103 is connected to an antenna, input terminal 104 is connected to a transmitter circuit, and output terminal 105 is connected to a receiver circuit in a telecommunications apparatus having electronic device 100 mounted thereto. Common terminal 103 is connected to filters 101 and 102 and phase shifter circuit 106. Filters 101 and 102 constitute main circuit 151 connected between input terminal 104 and output terminal 105. Auxiliary circuit 115 is connected in parallel to main circuit 151 between input terminal 104 and output terminal 105. Auxiliary circuit 115 includes capacitor element 111, resonator 113, and capacitor element 112. Capacitor element 111, resonator 113, and capacitor element 112 are connected in series in this order from input terminal 104 to output terminal 105. Capacitor elements 111 and 112 and resonator 113 are implemented by patterned electrodes formed on a single surface of piezoelectric substrate 161 on which filters 101 and 102 are formed. Resonator 113 is a surface acoustic wave resonator. According to Embodiment 4, a resonance frequency of resonator 113 is 929 MHz in passband 151RB ranging from 925 MHz to 960 MHz of filter 102 that is a reception band within stopband 151EB of filter 101. Auxiliary circuit 115 improves isolation. To be specific, the isolation characteristic can be improved by locating a resonance frequency of resonator 113•within passband 151RB of filter 102 or passband 151TB of filter 101. In addition, variations of frequencies due to a temperature can be generally equalized among the surface acoustic wave resonators that constitute filter 101 or 102 and resonator 113 by setting the resonance frequency of resonator 113 within passband 151TB or passband 151RB, thereby reducing degradation in the isolation characteristic due to changes of the ambient temperature.

According to Embodiment 4, the resonance frequency of resonator 113 is located inside passband 151RB for selectively passing a signal having a frequency within certain frequency band 115SB. In other words, an attenuation amount of auxiliary circuit 115 (i.e., resonator 113) in certain frequency band 115SB is smaller than an attenuation amount in any band other than certain frequency band 115SB. As a result, a frequency of auxiliary signal S115 output from auxiliary circuit 115 is restrained substantially within certain frequency band 115SB. In electronic device 100, a difference in phase between main signal S151 transmitted through main circuit 151 and auxiliary signal S115 transmitted through auxiliary circuit 115 can be about 180 degrees by adjusting an amount of phase shift of phase shifter circuit 106, and cancel main signal S151 transmitted from input terminal 104 to output terminal 105 in certain frequency band 115SB without influencing frequencies outside certain frequency band 115SB, thereby ensuring the isolation characteristic.

Figure 21:
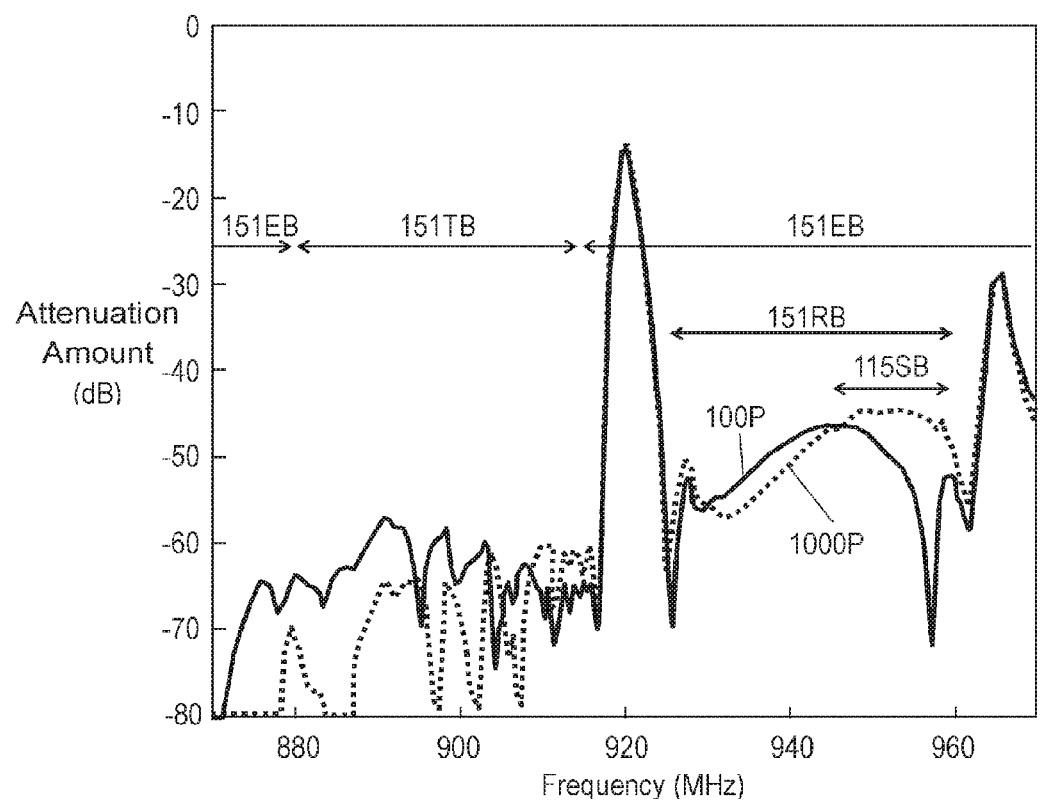
FIG. 21 is a characteristic chart of the electronic device according to Embodiment 4.

FIG. 21 shows isolation characteristic 100P of electronic device 100 functioning as the antenna duplexer according to Embodiment 4 and isolation characteristic 1000P of a comparative example of an electronic device. In FIG. 21, the vertical axis represents isolation, i.e., an attenuation amount of the signal that passes from input terminal 104 to output terminal 105 of electronic device 100, and the vertical axis represents a frequency.

The comparative example of the electronic device is conventional electronic device 1000 shown in FIG. 29 which does not include auxiliary circuit 115 of electronic device 100. Filter 1001 of electronic device 1000 of the comparative example has a passband, a transmission band, ranging from 880 MHz to 915 MHz, and filter 1002 has a passband, a reception band, ranging from 925 MHz to 960 MHz.

In FIG. 21, the larger the attenuation amount in the negative direction the better the isolation characteristic is. Certain frequency band 115SB according to Embodiment 4 ranges from 945 MHz to 960 MHz. In electronic device 100 according to Embodiment 4, the isolation characteristic is significantly improved in certain frequency band 115SB ranging from 945 MHz to 960 MHz in passband 151RB, the reception band, as shown in FIG. 21.

As discussed above, electronic device 100 according to Embodiment 4 includes filter 101 connected between common terminal 103 and input terminal 104, filter 102 connected between common terminal 103 and output terminal 105, and auxiliary circuit 115. Auxiliary circuit 115 is connected between two terminals out of common terminal 103, input terminal 104, and output terminal 105, and is connected in parallel to main circuit 151, filter 101, or filter 102. Auxiliary circuit 115 including capacitor element 111 (112) and resonator 113 can significantly improve the isolation characteristic.

In electronic device 100 according to Embodiment 4, filters 101 and 102 and resonator 113 are implemented by surface acoustic wave filters and a surface acoustic wave resonator. However, filters 101 and 102 and resonator 113 may be implemented by boundary acoustic wave filters and a boundary acoustic wave resonator, similarly improving the isolation characteristic.

Exemplary Embodiment b 5

Figure 22:
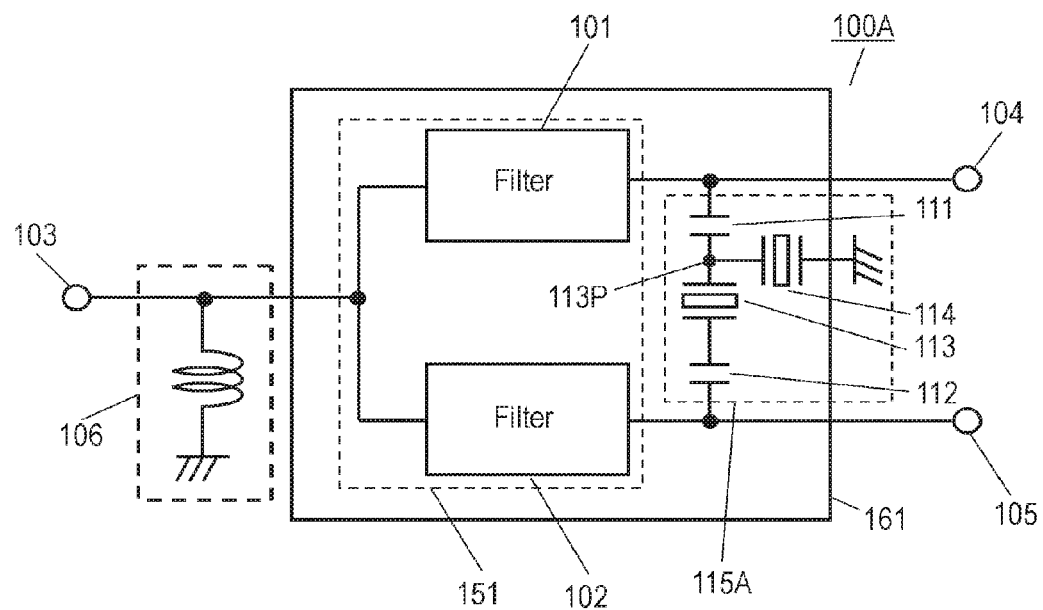
FIG. 22 is a circuit diagram of an electronic device according to Exemplary Embodiment 5 of the invention.

FIG. 22 is a circuit diagram of electronic device 100A, an antenna duplexer, according to Exemplary Embodiment 5. In FIG. 22, components identical to those of electronic device 100 according to Embodiment 4 shown in FIG. 20 are denoted by the same reference numerals. Electronic device 100A according to Embodiment 5 includes auxiliary circuit 115A instead of auxiliary circuit 115 of electronic device 100 according to Embodiment 4 shown in FIG. 20. Auxiliary circuit 115A further includes resonator 114 connected between a ground and node 113P at which capacitor element 111 is connected to resonator 113 in auxiliary circuit 115 shown in FIG. 20. A resonance frequency of resonator 114 is close to passband 151TB of filter 101 or passband 151RB of filter 102, and provides the antenna duplexer with low degradation in isolation characteristic against a change of an ambient temperature.

In order to improve the isolation in passband 151RB, i.e., a reception band, a resonance frequency of resonator 113 is determined to be, e.g. 929 MHz within passband 151RB, and the resonance frequency of resonator 114 is determined to be, e.g. 916 MHz near passband 151TB, a transmission band, so that temperature-dependent frequency drift characteristics of resonators that constitute filters 101 and 102 and resonators 113 and 114 can be substantially identical to each other, thereby improving the isolation characteristic in the reception band significantly, and providing the excellent antenna duplexer having low degradation in the isolation characteristic against changes in the ambient temperature.

Figure 23:
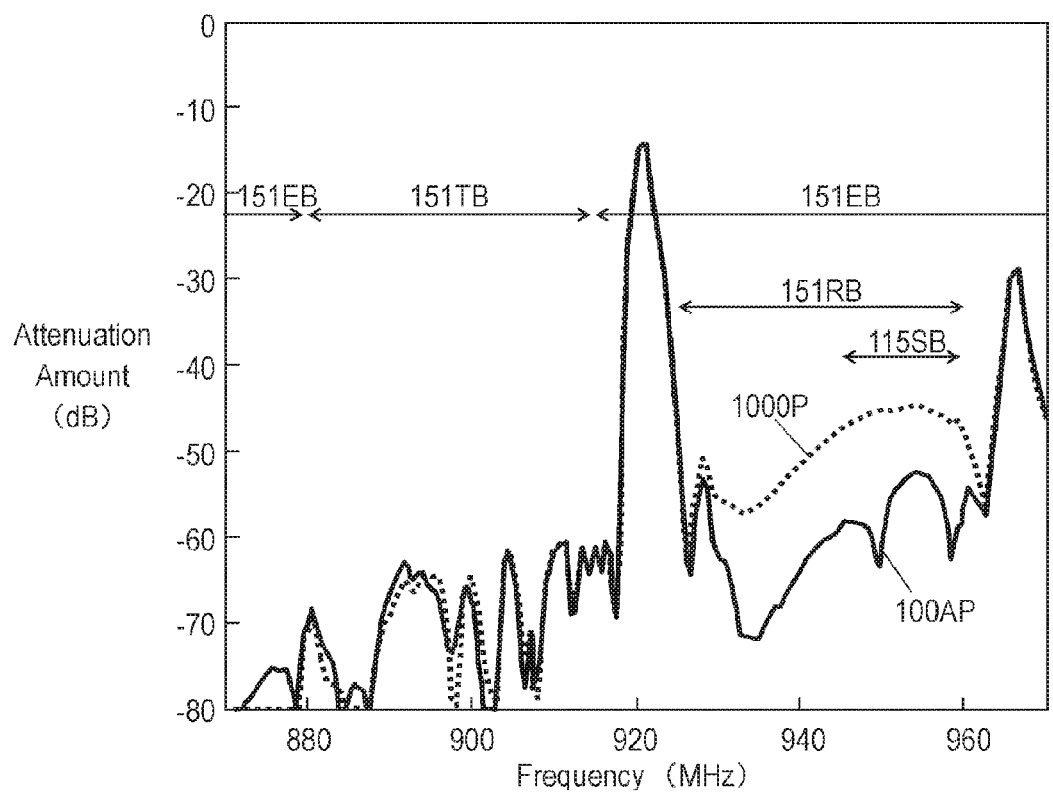
FIG. 23 is a characteristic chart of the electronic device according to Embodiment 5.

FIG. 23 shows isolation characteristic 100AP of electronic device 100A according to Embodiment 5 and isolation characteristic 1000P of a comparative example of an electronic device. In FIG. 23, the vertical axis represents an attenuation amount of a signal that passes from input terminal 104 to output terminal 105, and the horizontal axis represents a frequency.

As shown in FIG. 23, a substantial improvement is shown in the isolation characteristic over a frequency range of 925 MHz to 960 MHz in the reception band of electronic device 100A according to Embodiment 5 as compared to electronic device 1000 of the comparative example.

Figure 24:
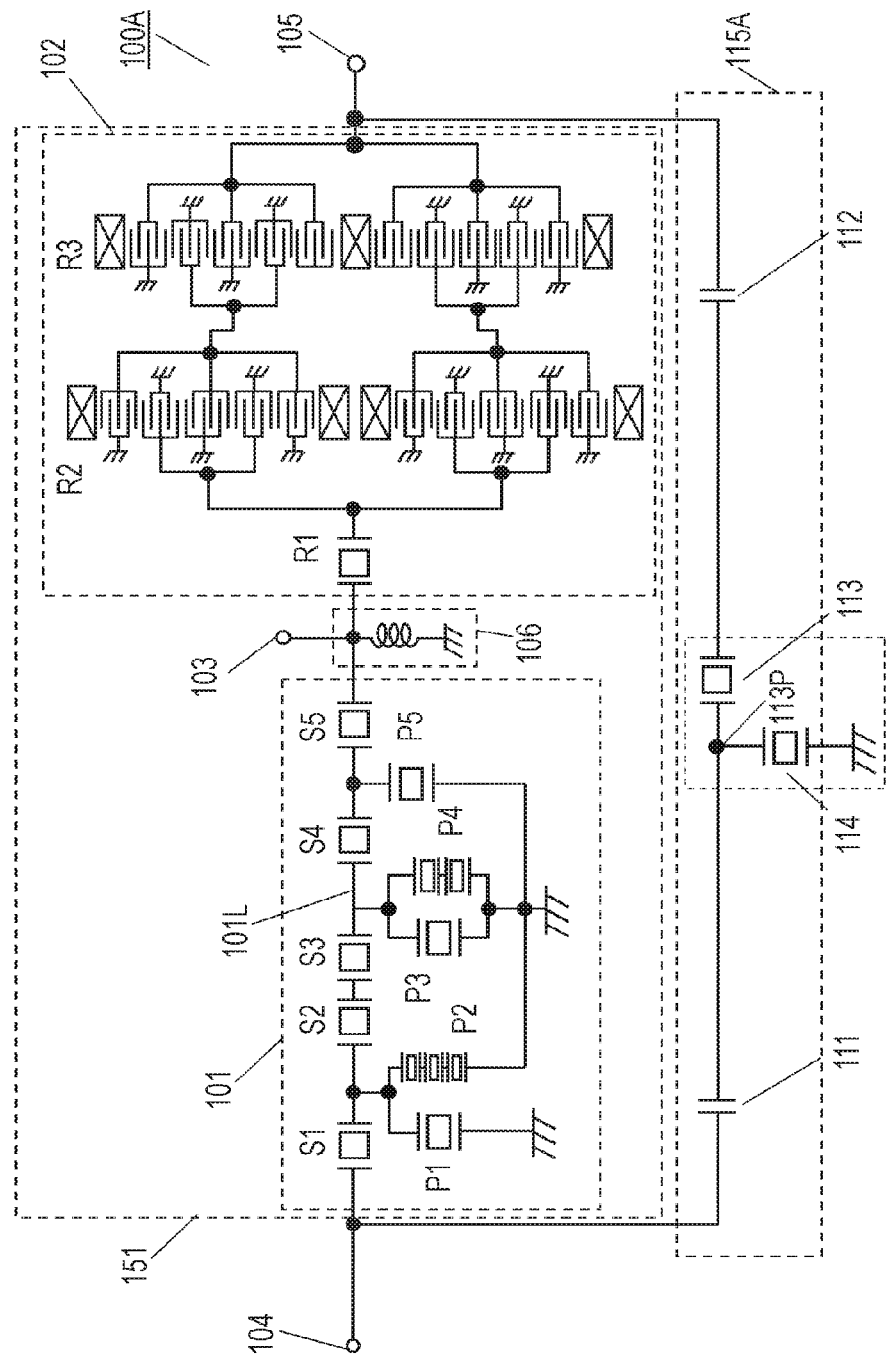
FIG. 24 is a circuit diagram of the electronic device according to Embodiment 5.

FIG. 24 is a detailed circuit diagram of electronic device 100A. Filter 101 includes series arm resonators S1, S2, S3, S4, and S5 connected in series to each other along signal line 101L from input terminal 104 to common terminal 103. Filter 101 further includes parallel arm resonators P1, P2, P3, P4, and P5 connected between signal line 101L and the ground. Filter 102 has 2-terminal resonator R1 and longitudinally coupled resonators R2 and R3 connected between common terminal 103 and output terminal 105. Auxiliary circuit 115A is connected in parallel to main circuit 151 including filters 101 and 102 between input terminal 104 and output terminal 105. In auxiliary circuit 115A, capacitor element 111, resonator 113 and capacitor element 112 are connected in series in this order while resonator 114 is connected between the ground and node 113P at which capacitor element 111 is connected to resonator 113. Capacitor element 111 is connected between input terminal 104 and resonator 113. Capacitor element 112 is connected between output terminal 105 and resonator 113. Capacitor element 111 is closer to input terminal 104 than capacitor element 112 is while capacitor element 112 is closer to output terminal 105 than capacitor element 111 is.

The capacitances of capacitor elements 111 and 112 are smaller than the capacitance of resonator 113. The capacitance of capacitor element 111 closer to input terminal 104 is smaller than that of capacitor element 112 closer to output terminal 105. This arrangement improves an isolation characteristic.

Figure 25:
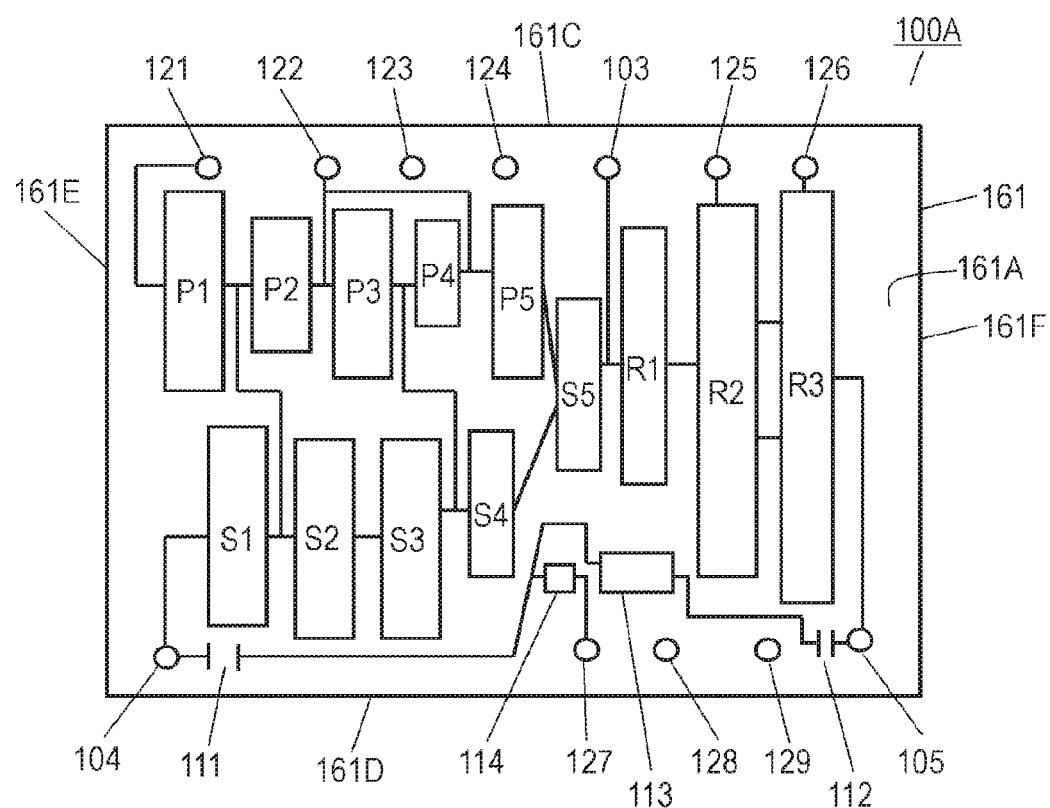
FIG. 25 is a schematic plan view of the electronic device according to Embodiment 5.

FIG. 25 is a schematic plan view of electronic device 100A shown in FIG. 24. Series arm resonators S1, S2, S3, S4, and S5 and parallel arm resonators P1, P2, P3, P4, and P5 that constitute filter 101, 2-terminal resonator R1 and longitudinally coupled resonators R2 and R3 that constitute filter 102, capacitor elements 111 and 112, and resonators 113 and 114 are formed on main surface 161A of piezoelectric substrate 161. All these components are provided on single piezoelectric substrate 161 in the above configuration, hence providing the antenna duplexer with a small size and an excellent isolation characteristic. Piezoelectric substrate 161 has a rectangular shape having long sides 161C and 161D opposite to each other and short sides 161E and 161F opposite to each other. Common terminal 103 is located at a position facing long side 161C. Parallel arm resonators P1, P2, P3, P4, and P5 that constitute filter 101 are arranged along long side 161C where common terminal 103 is disposed. Series arm resonators S1, S2, S3, S4, and S5 are arranged along long side 161D of piezoelectric substrate 161. In other words, parallel arm resonators P1, P2, P3, P4, and P5 are disposed closer to long side 161C than series arm resonators S1, S2, S3, S4, and S5 are while series arm resonators S1, S2, S3, S4, and S5 are disposed closer to long side 161D than parallel arm resonators P1, P2, P3, P4, and P5 are. Resonators 113 and 114 that constitute auxiliary circuit 115 for improving the isolation are located at positions facing long side 161D. That is, resonators 113 and 114 are disposed closer to long side 161D than to long side 161C. This configuration can improve the isolation characteristic of electronic device 100A.

Common terminal 103 is disposed in a direction toward filter 102 from the center of long sides 161C and 161D of piezoelectric substrate 161 that equally divides the long sides. This configuration provides electronic device 100A with a superior resistance to power and a low resistance loss in the wiring since it can shorten the wiring on piezoelectric substrate 207 while maintaining an area occupied by the series arm resonators and the parallel arm resonators that constitute filter 101.

Dummy terminals 123 and 124 not connected electrically to any of the resonators are disposed between common terminal 103 and ground terminals 121 and 122 of the parallel arm resonators of filter 101. This configuration can prevent a signal of the parallel arm resonators from leaking to common terminal 203 due to electromagnetic coupling, and improve the isolation.

Ground terminal 125 grounds a grounding electrode of longitudinally coupled resonator R2. Ground terminal 126 grounds a grounding electrode of longitudinally coupled resonator R3. Ground terminals 125 and 126 are electrically separated on piezoelectric substrate 161. This configuration can increase the attenuation amount of filter 102, improving the isolation characteristic.

Ground terminal 127 grounds resonator 114. All of dummy terminals 123, 124, 128 and 129 are grounded, but are not connected to any of the resonators. These terminals improve the isolation between input terminal 104 and common terminal 103, the isolation between output terminal 105 and common terminal 103, as well as the isolation between input terminal 104 and output terminal 105, in addition to reinforcing a fixing strength of piezoelectric substrate 161.

Exemplary Embodiment 6

Figure 26:
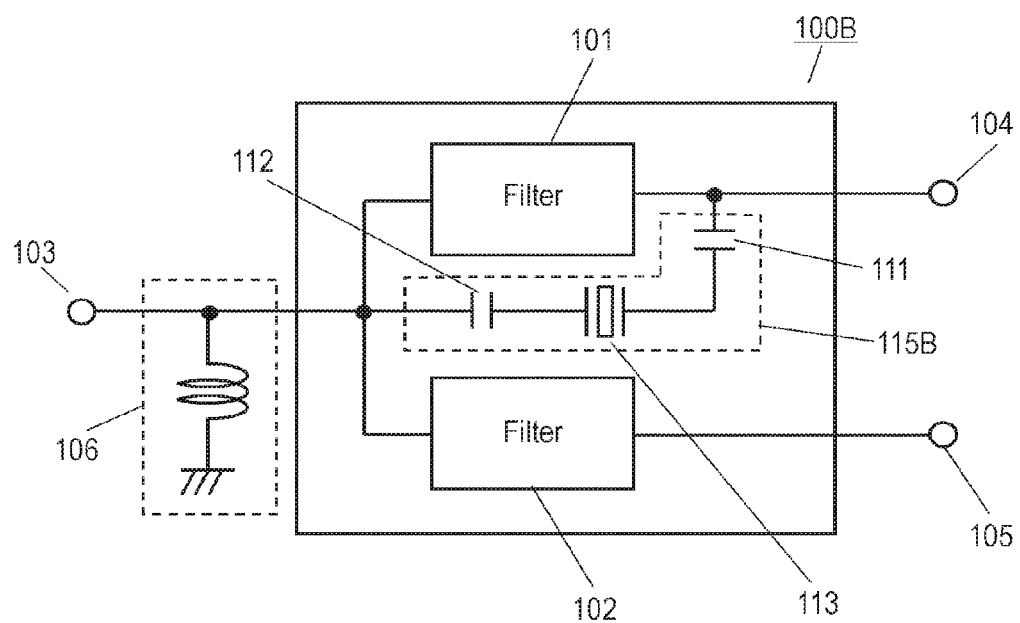
FIG. 26 is a circuit diagram of an electronic device according to Exemplary Embodiment 6 of the invention.

FIG. 26 is a circuit diagram of electronic device 100B, an antenna duplexer, according to Exemplary Embodiment 6 of the present invention. In FIG. 26, components identical to those of electronic device 100 according to Embodiment 4 shown in FIG. 20 are denoted by the same reference numerals.

In electronic device 100B according to Embodiment 6, auxiliary circuit 115B is connected in parallel to filter 101 between input terminal 104 and common terminal 103 for improving isolation characteristic. That is, capacitor element 111, resonator 113, and capacitor element 112 are connected in series between input terminal 104 and common terminal 103. This structure increases an attenuation amount of filter 101 in passband 151RB of filter 102, thereby improving the isolation characteristic of filter 102 in the passband 151RB.

Figure 27:
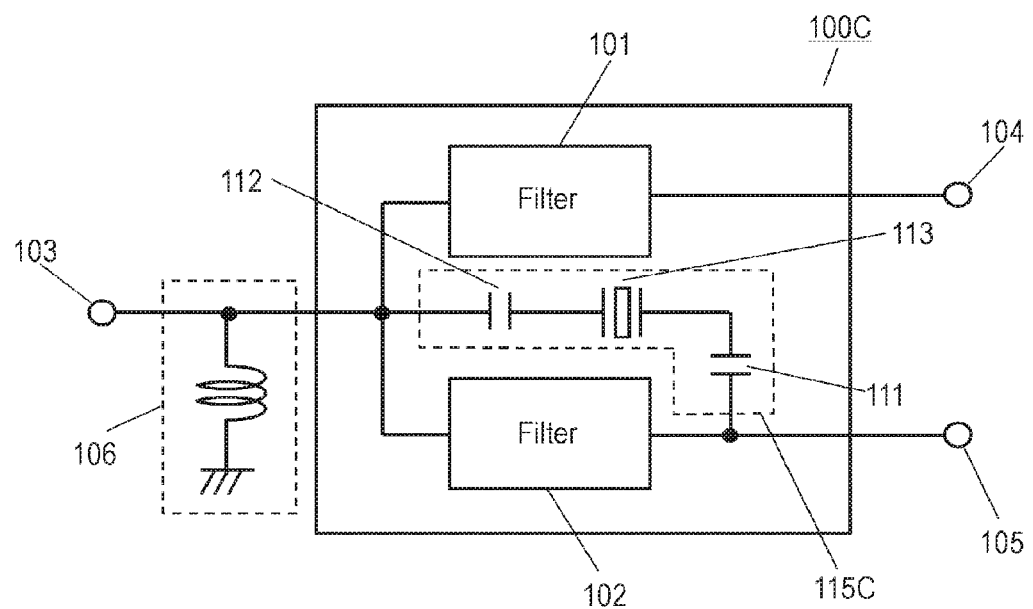
FIG. 27 is a circuit diagram of another electronic device according to Embodiment 6.
Figure 28:
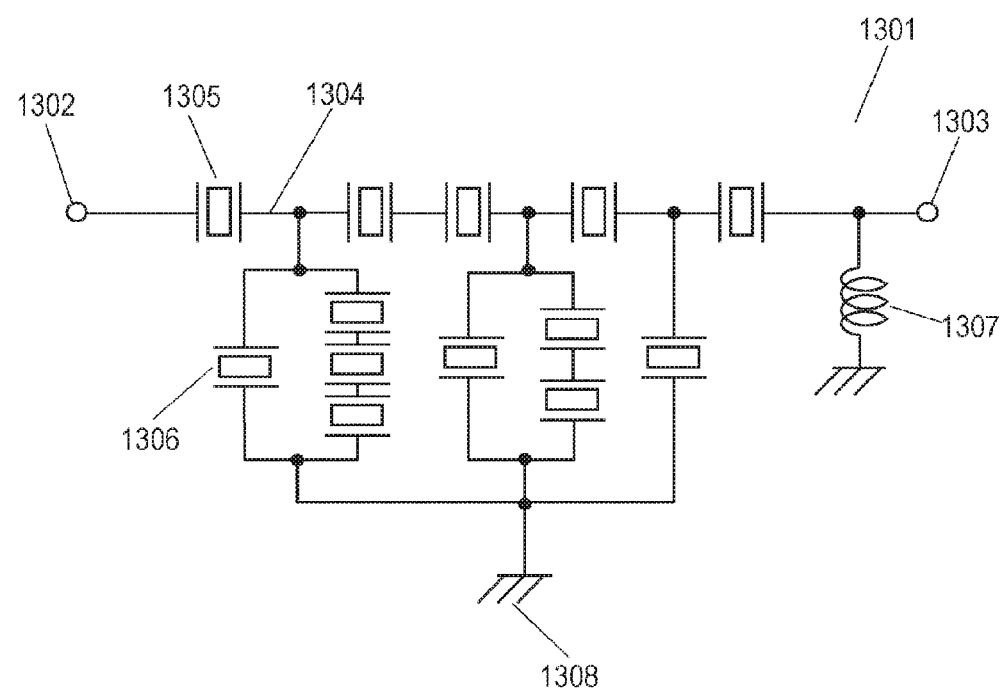
FIG. 28 is a circuit diagram of a conventional electronic device.

FIG. 27 is a circuit diagram of another electronic device 100C, an antenna duplexer, according to Embodiment 6. In FIG. 27, components identical to those of electronic device 100 according to Embodiment 4 shown in FIG. 20 are denoted by the same reference numerals.

In electronic device 100C according to Embodiment 6, auxiliary circuit 115C is connected in parallel to filter 102 between output terminal 105 and common terminal 103 for improving of the isolation characteristic. In other words, capacitor element 111, resonator 113, and capacitor element 112 are connected in series between output terminal 105 and common terminal 103. This structure increases an attenuation amount of filter 102 in passband 151TB of filter 101, a transmission band, thereby improving the isolation characteristic in passband 151TB.

What is claimed is:

1. A high-frequency filter comprising:
   first and second signal terminals;
   a filter circuit having a passband and a stopband and being connected between the first signal terminal and the second signal terminal, the filter circuit configured to provide a first output signal responsive to receipt of an input signal; and
   an additional circuit connected in parallel with the filter circuit between the first signal terminal and the second signal terminal, the additional circuit unit having an attenuation band within the stopband, the additional circuit being configured to provide a second output signal responsive to receiving the input signal, the first and second output signals having phase components opposite to each other in the attenuation band.

2. The high-frequency filter of claim 1 further comprising a piezoelectric substrate, the filter circuit and the additional circuit being formed on the piezoelectric substrate.

3. The high-frequency filter of claim 1 wherein the additional circuit includes two interdigital transducer (IDT) electrodes disposed spaced apart from one another by a predetermined distance on a single acoustic wave path along which acoustic waves propagate through the two IDT electrodes.

4. The high-frequency filter of claim 3 wherein the phase components are adjusted by setting the predetermined distance.

5. The high-frequency filter of claim 3 wherein the additional circuit further includes a first capacitor element connected between the two IDT electrodes and the first signal terminal, and a second capacitor element connected between the two IDT electrodes and the second signal terminal.

6. The high-frequency filter of claim 5 wherein a first capacitance of the first capacitor element is less than a second capacitance of the second capacitor element.

7. The high-frequency filter of claim 6 wherein the first and second capacitances are less than capacitances of the two IDT electrodes.

8. The high-frequency filter of claim 5 wherein the filter circuit includes a plurality of acoustic wave elements.

9. The high-frequency filter of claim 8 wherein the plurality of acoustic wave elements includes a plurality of filter IDT electrodes.

10. The high-frequency filter of claim 9 wherein each of the two IDT electrodes of the additional circuit and each of the plurality of filter IDT electrodes of the filter circuit includes a pair of comb-shaped electrodes having electrode fingers that interdigitate with each other, and wherein a first electrode-finger pitch of the two IDT electrodes of the additional circuit is less than a second electrode-finger pitch of the plurality of filter IDT electrodes of the filter circuit.

11. The high-frequency filter of claim 8 wherein the plurality of acoustic wave elements includes a plurality of series-arm resonators connected in series with one another along a signal path extending between the first and second signal terminals, and a plurality of parallel-arm resonators connected between the signal path and a reference potential, the plurality of series-arm resonators and the plurality of parallel-arm resonators arranged in a ladder configuration.

12. The high-frequency filter of claim 11 wherein the additional circuit further includes a shield electrode disposed between the two IDT electrodes and connected to the reference potential.

13. The high-frequency filter of claim 1 wherein the additional circuit further includes an element configured to shift an amplitude level of a frequency domain passing characteristic of the additional circuit.

14. The high-frequency filter of claim 13 wherein the element is a capacitor element.

15. A high-frequency filter comprising:
an antenna terminal;
a transmission terminal;
a reception terminal;
a piezoelectric substrate;
a transmission filter connected between the antenna terminal and the transmission terminal, the transmission filter including a plurality of series-arm acoustic wave resonators and a plurality of parallel-arm acoustic wave resonators arranged to form a ladder circuit and formed on the piezoelectric substrate;
a reception filter connected between the antenna terminal and the reception terminal; and
a phase circuit connected between at least two of the antenna terminal, the transmission terminal and the reception terminal, the phase circuit including a first capacitor, a second capacitor, and at least one interdigital transducer (IDT) electrode formed on the piezoelectric substrate and connected between the first and second capacitors.

16. The high-frequency filter of claim 15 wherein the phase circuit is connected between the antenna terminal and the transmission terminal.

17. The high-frequency filter of claim 15 wherein the reception filter includes a two-terminal acoustic wave resonator and a pair of longitudinally-coupled resonators connected in series between the antenna terminal and the reception terminal.

18. The high-frequency filter of claim 15 wherein the phase circuit is a transversal filter including two IDT electrodes.

19. The high-frequency filter of claim 18 wherein the transmission filter has a first passband and a first stopband, the reception filter has a second stopband and a second passband that at least partially overlaps the first stopband in the frequency domain, and the phase circuit has an attenuation band positioned within the first stopband and within the second passband in the frequency domain, the transmission filter having a first frequency domain phase characteristic within first passband, and the phase circuit having a second frequency domain phase characteristic that is opposite to the first frequency domain phase characteristic within the attenuation band.

20. The high-frequency filter of claim 19 wherein the transmission filter has a first frequency domain amplitude characteristic in the first passband, and the phase circuit has a second frequency domain amplitude characteristic that differs from the first frequency domain amplitude characteristic by less than 10 dB within the attenuation band.

* * * * *

UNITED STATES PATENT AND TRADEMARK OFFICE
CERTIFICATE OF CORRECTION

PATENT NO. : 9,722,573 B2
APPLICATION NO. : 15/375803
DATED : August 1, 2017
INVENTOR(S) : Joji Fujiwara et al.

Page 1 of 1

It is certified that error appears in the above-identified patent and that said Letters Patent is hereby corrected as shown below:

In the Specification

Column 9, Line 38, delete "917" and insert -- 971 --.

Column 16, Line 8, delete "917" and insert -- 971 --.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*